(12) United States Patent
Castantini et al.

(10) Patent No.: US 8,500,382 B2
(45) Date of Patent: Aug. 6, 2013

(54) AIRFLOW MANAGEMENT FOR PARTICLE ABATEMENT IN SEMICONDUCTOR MANUFACTURING EQUIPMENT

(75) Inventors: James S. Castantini, Newburyport, MA (US); Tent-Chao D. Tao, Saugus, MA (US); Erin M. Madden, Lynnfield, MA (US); Donald N. Polner, Marblehead, MA (US)

(73) Assignee: Axcelis Technologies Inc., Beverly, MA (US)

( * ) Notice: Subject to any disclaimer, the term of this patent is extended or adjusted under 35 U.S.C. 154(b) by 1595 days.

(21) Appl. No.: 11/752,118

(22) Filed: May 22, 2007

(65) Prior Publication Data

US 2008/0292432 A1    Nov. 27, 2008

(51) Int. Cl.
*H01L 21/677* (2006.01)

(52) U.S. Cl.
USPC ........... 414/217; 414/805; 414/935; 118/715; 118/723 R

(58) Field of Classification Search
USPC ................ 118/58, 715, 500, 723 R; 414/217, 414/805, 935
See application file for complete search history.

(56) References Cited

U.S. PATENT DOCUMENTS

| | | | |
|---|---|---|---|
| 4,653,386 A * | 3/1987 | Hayakawa et al. | 454/316 |
| 5,491,337 A * | 2/1996 | Jenkins et al. | 250/287 |
| 6,427,096 B1 * | 7/2002 | Lewis et al. | 700/228 |
| 6,668,844 B2 * | 12/2003 | Lund et al. | 134/155 |
| 6,753,506 B2 | 6/2004 | Liu et al. | |
| 6,782,843 B2 | 8/2004 | Kinnard et al. | |
| 6,877,946 B2 | 4/2005 | Kinnard et al. | |
| 6,987,272 B2 | 1/2006 | Ota et al. | |
| 7,059,817 B2 | 6/2006 | Sieradzki et al. | |
| 7,217,076 B2 | 5/2007 | Bonora et al. | |
| 7,221,993 B2 | 5/2007 | Rice et al. | |
| 7,665,951 B2 * | 2/2010 | Kurita et al. | 414/805 |
| 2005/0142010 A1 | 6/2005 | Bailey et al. | |
| 2005/0258162 A1 * | 11/2005 | Kusuda et al. | 219/411 |
| 2006/0065194 A1 | 3/2006 | Ham | |
| 2007/0098527 A1 | 5/2007 | Hall et al. | |

* cited by examiner

*Primary Examiner* — Saul Rodriguez
*Assistant Examiner* — Willie Berry, Jr.
(74) *Attorney, Agent, or Firm* — Eschweiler & Associates, LLC

(57) ABSTRACT

An airflow management system and/or method used in particle abatement in semiconductor manufacturing equipment. In particular, the apparatus disclosed is capable of creating and managing a carefully controlled particle free environment for the handling of semiconductor wafers or similar articles. The apparatus is particularly suited to be used as an interface between an equipment front end module (EFEM) and a vacuum loadlock chamber or other such article of process equipment. The apparatus also enables relative motion between enclosures while maintaining a particle free environment utilizing a moving air diffuser mounted to an interface panel.

25 Claims, 19 Drawing Sheets

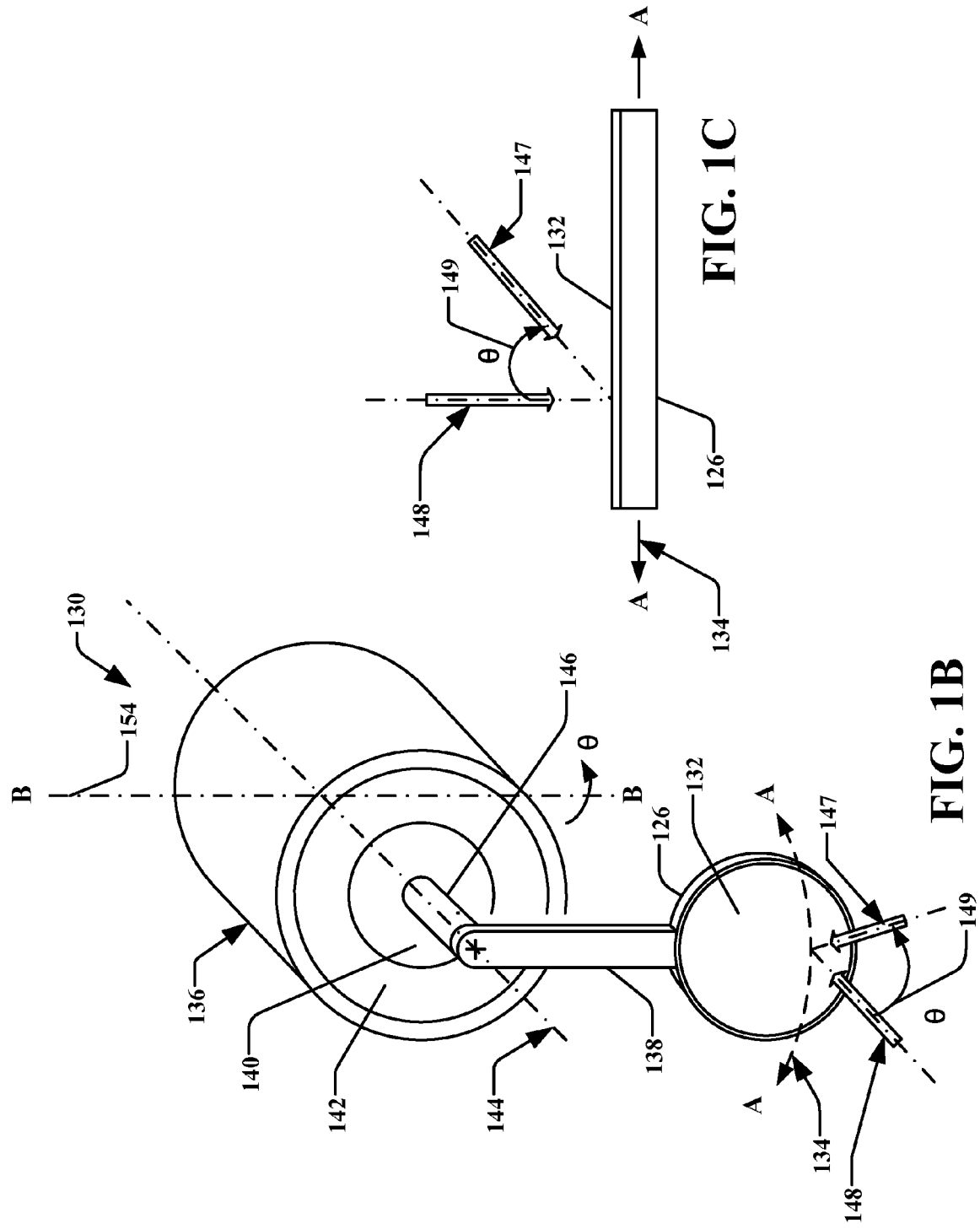

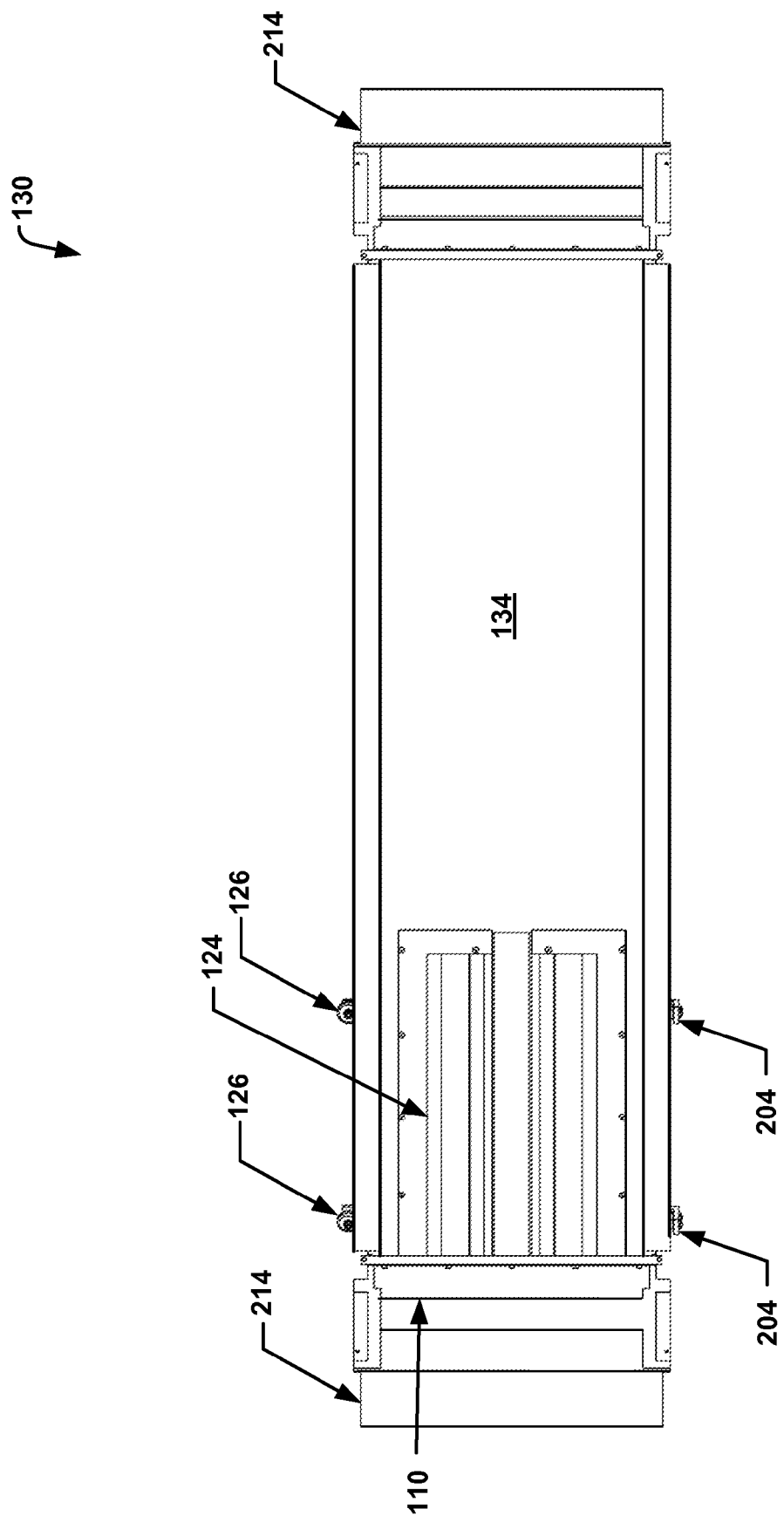

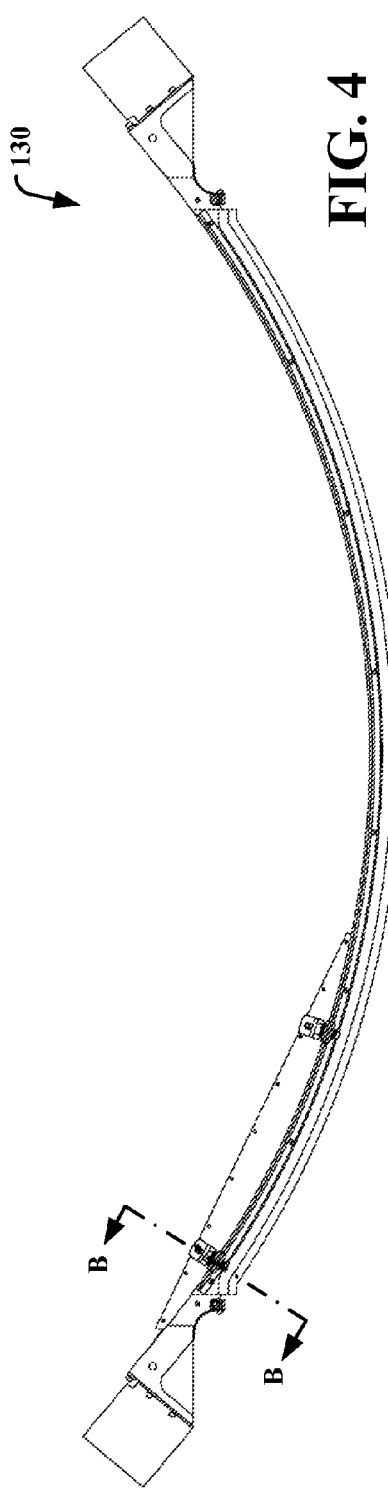
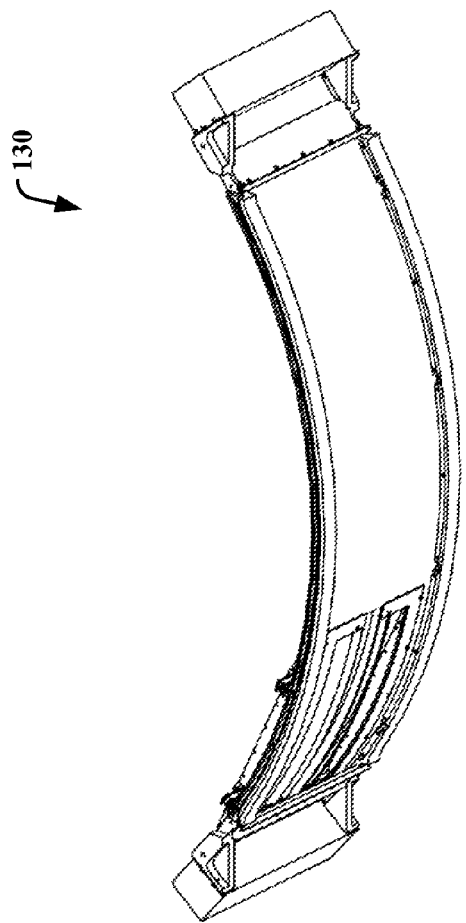
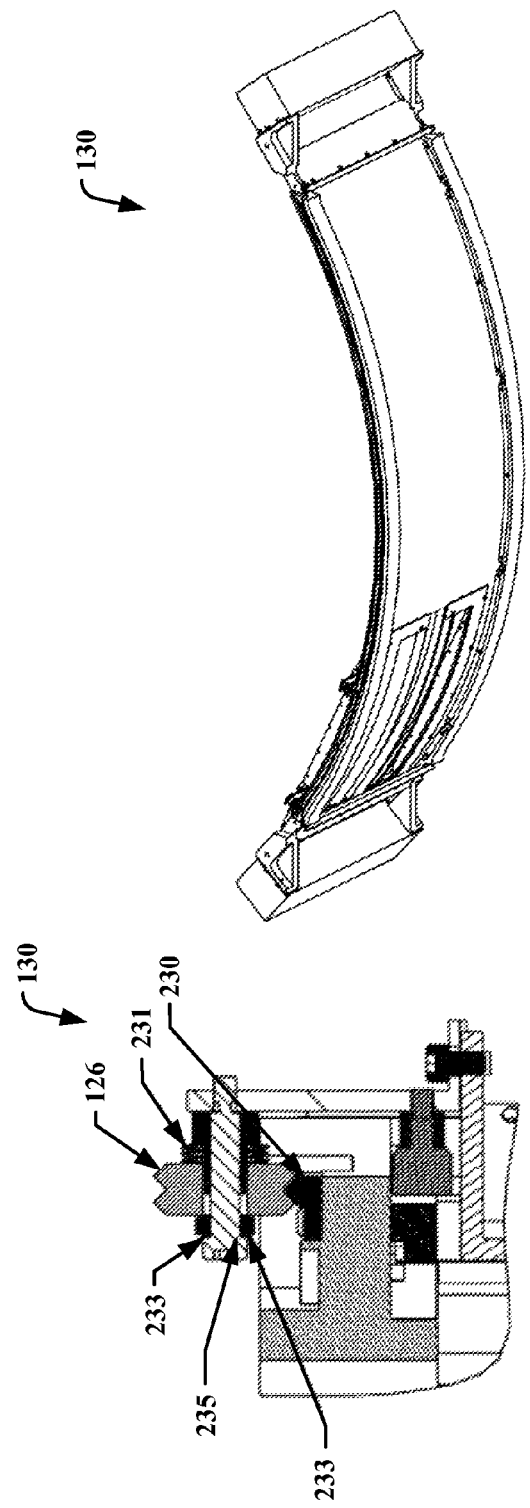

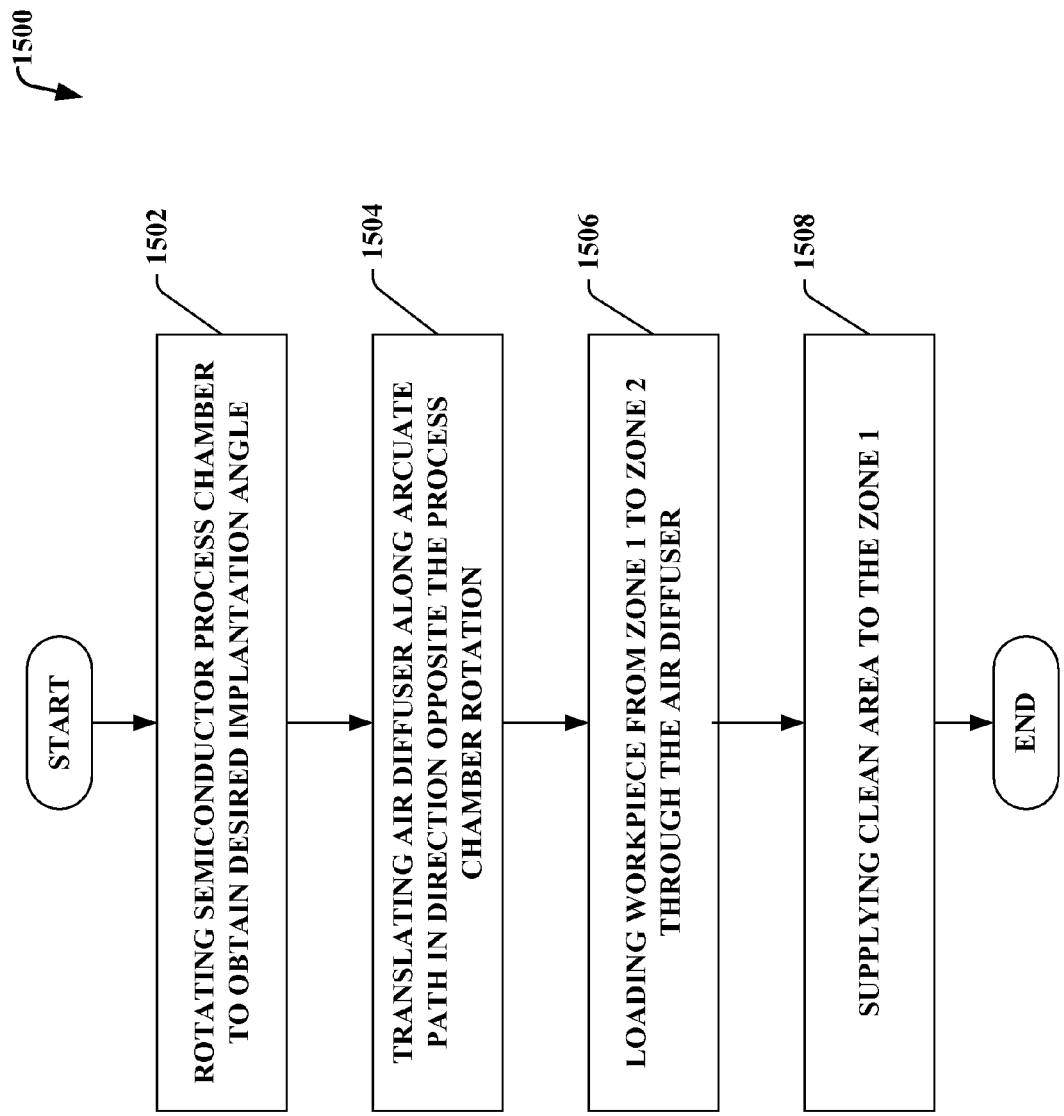

AIRFLOW MANAGEMENT FOR PARTICLE ABATEMENT IN SEMICONDUCTOR MANUFACTURING EQUIPMENT

FIELD OF THE INVENTION

The present invention relates generally to an apparatus and method for creating, managing, and maintaining a particle free environment for the handling of the semiconductor wafers or workpieces. More particularly, the present invention relates to an enclosed particle free interface and containment system between the EFEM and a wafer processing module.

BACKGROUND OF THE INVENTION

Shortening cycle times to fabricate semiconductors is critical to the success of semiconductor manufacturing. A key factor in cycle time is the movement of workpieces from the equipment front end module (EFEM) into an air management system/load lock area. Shortened cycle times are critical to operational success allowing lean inventory, better yields, and the like.

Semiconductor manufacturing requires an ultra clean environment for the silicon wafers or workpieces during the manufacturing process; therefore it is necessary to provide a filtered and controlled airflow of sufficient velocity to prevent airborne particles from migrating to the wafer surface, thereby contaminating the wafer and resulting in reduced production yields. Airflow recirculation near the wafer is significant source of airborne particles settling on the wafer surface.

Customers often require that the implantation takes place at an angle, between zero degrees (0°) and ninety degrees (90°). In various implantation devices this requires that the process chamber rotate relative to the stationary ion implanter, for example. Current technologies and techniques allow for relative motion to occur between wafer handling apparatus and process modules, however when changing the implantation angle the process chamber often has to go back into a position so that new workpieces can be loaded into the load lock area or air management system. This results in reduced cycle times.

Thus, it is desirable to provide an apparatus and method for allowing the relative motion between the process chamber and the air management system which allows for loading workpieces without the subsequent movement of the process chamber.

SUMMARY OF THE INVENTION

The present invention overcomes the limitations of the prior art by providing an apparatus and method for controlling airflow while allowing for relative motion to occur between wafer handling and processing modules. The apparatus consists of a movable diffuser connected to the containment shroud by means of an interface panel. Airflow between the modules is controlled by the design of the diffuser and an adjustable exhaust damper panel at the airflow exit side of the shroud.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1B illustrates a front perspective view of a reciprocating drive apparatus according to another aspect of the present invention;

FIG. 1C is a side view of an exemplary change in the ion implantation angle on a workpiece according to another aspect of the present invention;

FIG. 3 is a front view of an interface panel in accordance with another aspect of the invention;

FIG. 4 is a top view of an interface panel in accordance with another aspect of the invention;

FIG. 5 is a cross-sectional view of the vee bearing assembly according to an aspect of the invention;

FIG. 6 is a top perspective view of the interface panel in accordance with another aspect of the invention;

FIG. 15 is a flow chart illustrating an exemplary air management technique according to yet another aspect of the present invention.

DETAILED DESCRIPTION OF THE INVENTION

Figure 1A:
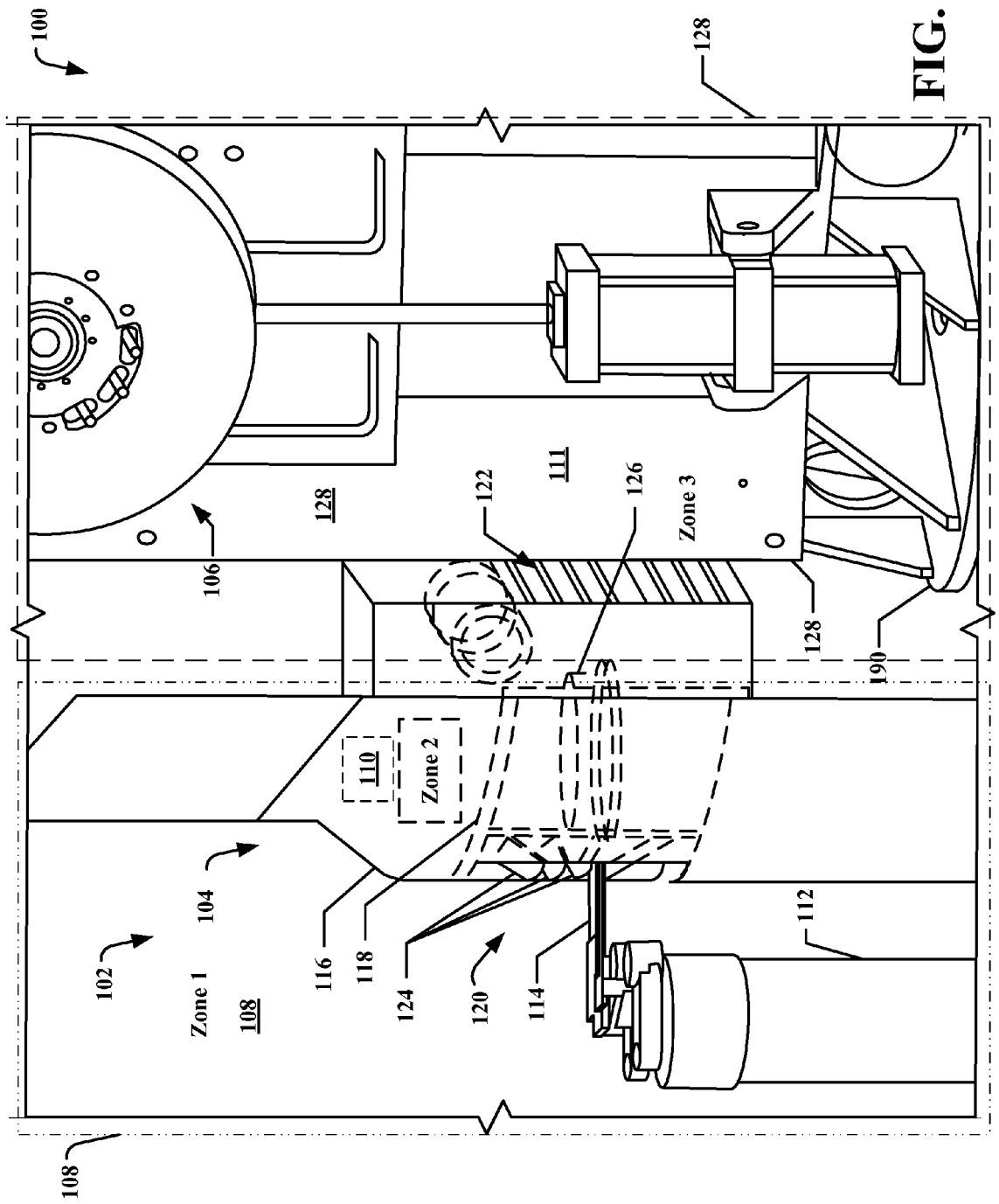
FIG. 1A illustrates an exemplary semiconductor implant system utilizing an air flow management component and movable air diffuser in accordance with one aspect of the present invention.

The present invention is directed generally toward a reduced cycle time airflow management system and method for controlling particle abatement in semiconductor manufacturing equipment. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1A illustrates an exemplary semiconductor implantation system 100 comprising an equipment front end module (EFEM) 102, an air management system (AMS) 104 and an exemplary reciprocating drive system (RDS) 106. The EFEM 102 is a component in semiconductor automation, moving work pieces between a "dirty" processing areas and "clean" areas, for example. Equipment front end modules 102 were developed in response to the requirement for higher yields, faster throughput, contamination reduction, and the like, while maintaining ever-shrinking geometries in the semiconductor industry. Contamination levels that were acceptable a short time ago are no longer acceptable for many products.

The equipment/environmental front end module 102 can be configured with a shroud (not shown) defining a protected environmental area where work pieces may be reached and handled with minimum potential for contamination of the workpiece. In one embodiment the EFEM 102 comprises a robot 112 with robotic arms 114 for holding and moving a workpiece (not shown) and an air management system 104 for circulating air around a workpiece. The robot 112 in this embodiment can translate along a pathway, for example, linear, curvilinear, and the like, or the robot 112 in another embodiment can be stationary. In addition, robotic arms 114 can translate or rotate or both, for example. It will be understood that the EFEM 102 of FIG. 1A can be configured to move the workpiece from a "clean" zone 1 or first zone (108), illustrated in FIG. 1A, as a dashed line, into a zone 2 or second zone (110) within the air management system 104.

The exemplary airflow management system 104 comprises a shroud 116, an interface panel 118 configured with a moving diffuser 120, and an adjustable damper 122, wherein the moving diffuser 120 is generally configured with vanes 124. The moving diffuser 120 provides an opening between Zone 1 (108) and inside the AMS 104 referred to as Zone 2 (110). The AMS 104 further comprises a support surface or platen 126 for supporting the workpiece, wherein the moving diffuser 120 is configured to move in order to align the translating robot 112 and the robotic arms 114, the air diffuser 120 and the platen 126 within the chamber interior of Zone 2 (110). The air management system 104 can be fixedly attached to a rotating process chamber 128, for example.

According to the present invention, the reciprocating drive apparatus (RDS) 106 can be located within and extending through the process chamber 128, for example. FIG. 1A illustrates the outside of the process chamber 128, for example. The chamber 128 may comprise a generally enclosed vacuum chamber 128, wherein an internal environment within the process chamber is operable to be generally isolated from an external environment outside the process chamber. For example, the vacuum chamber 128 can be configured and equipped so as to maintain the internal environment at a substantially low pressure (e.g., a vacuum). The process chamber 128 may be further coupled to one or more load lock chambers, well known by those of ordinary skill in the art, wherein the workpiece may be transported between the internal environment of the process chamber 128 and the external environment, Zone 1 (108) without substantial loss of vacuum within the process chamber 128. The process chamber 128 may alternatively be comprised of a generally non-enclosed process space, wherein the process space is generally associated with the external environment.

Figure 1D:
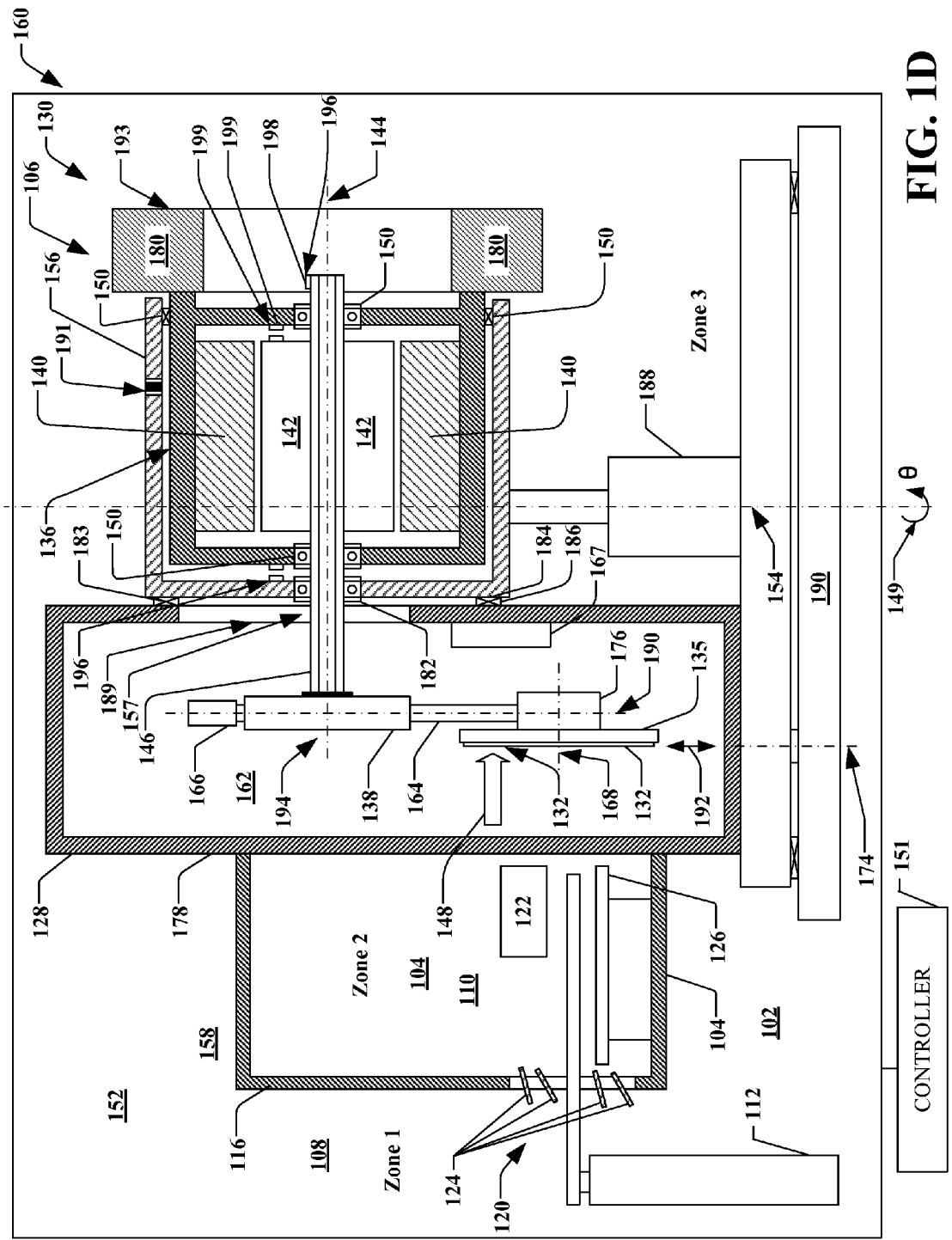
FIG. 1D illustrates a side partial cross sectional view of an exemplary reciprocating drive apparatus system according to another aspect of the present invention.
Figure 1E:
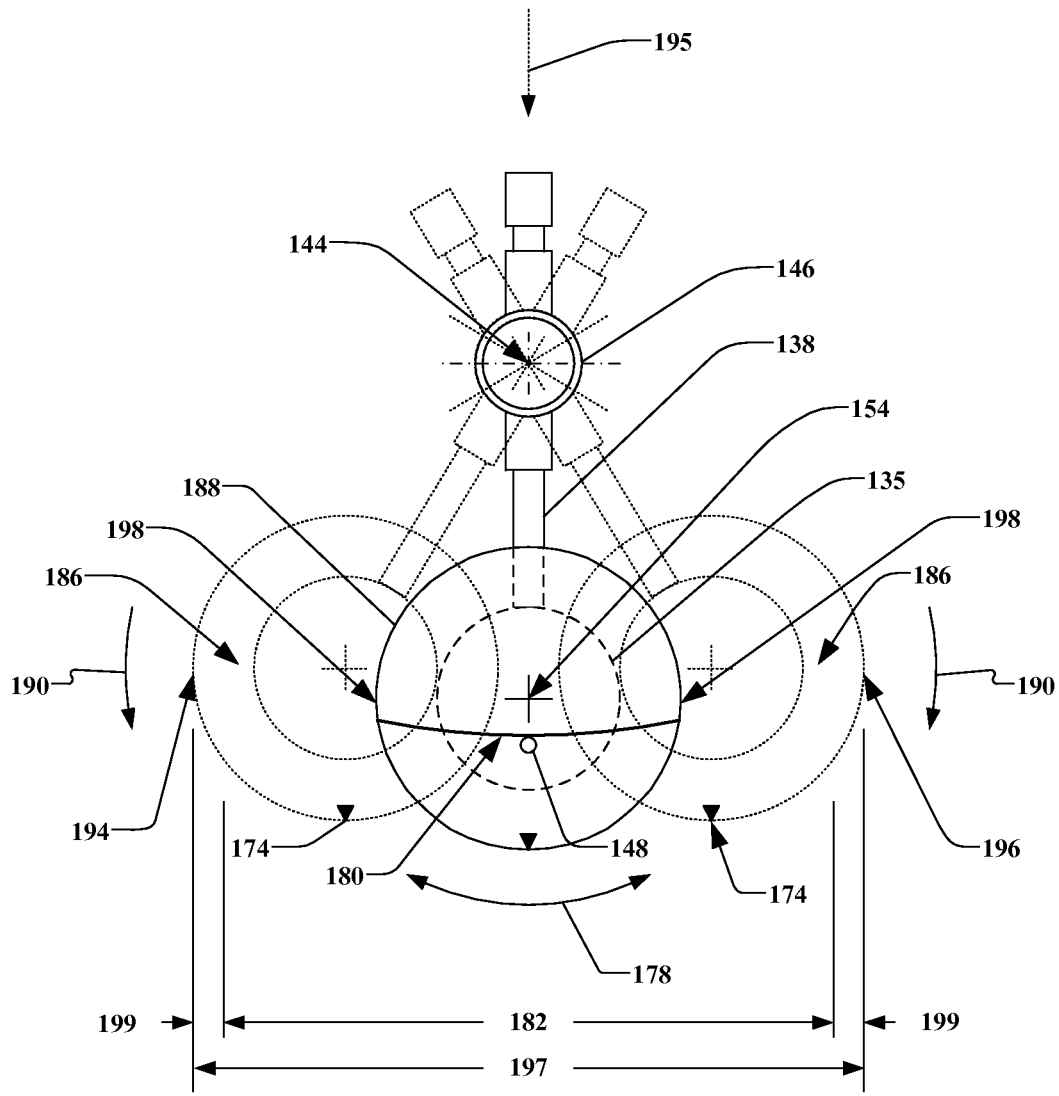
FIG. 1E illustrates a front view of the reciprocating arm in accordance with still another aspect of the invention.

FIGS. 1B, 1D and 1E illustrate simplified views of an exemplary reciprocating drive apparatus 130 operable within a process chamber 128 to reciprocally translate or oscillate a workpiece 132 along a predetermined first scan path 134. The process chamber 128 is used with an exemplary air management system 104, according to one aspect of the present invention. It should be noted that the reciprocating drive apparatus 130 of FIGS. 1B, 1D and 1E is illustrated to provide an upper-level understanding of the invention, and is not necessarily drawn to scale. Accordingly, various components may or may not be illustrated for clarity purposes. It shall be understood that the various features illustrated can be of various shapes and sizes, or excluded altogether, and that all such shapes, sizes, and exclusions are contemplated as falling within the scope of the present invention. Additionally, the air management system 104 can be configured to operate with the non-reciprocating drive system, for example, and is a key in the present invention.

As implied by the use of the term "reciprocating drive apparatus", in one example, the drive apparatus 130 of the present invention, illustrated in FIG. 1B is operable to reciprocally translate or oscillate the workpiece 132 in a reversible motion along the first scan path 134, such that the workpiece translates alternatingly back and forth with respect to a generally stationary ion beam 147 or 148, wherein the apparatus can be utilized with the air management system 104 in an ion implantation process, as will be discussed hereafter in greater detail. Alternatively, the air management system 104 and the reciprocating drive apparatus 130 may be utilized in conjunction with various other processing systems, which may include other semiconductor manufacturing processes such as, for example, a step-and-repeat lithography system. In yet another alternative, the air management system 104 can be utilized in various processing systems not related to semiconductor manufacturing technology, and all such systems and implementations are contemplated as falling within the scope of the present invention.

According to one aspect of the present invention, the reciprocating drive apparatus 130 comprises a motor 136 operably coupled to a scan arm 138 wherein the scan arm is further operable to support the workpiece 132 thereon. The motor 136, for example, comprises a rotor 140 and a stator 142, wherein the rotor 140 and the stator 142 are dynamically coupled and operable to individually rotate about a first axis 144. The rotor 140 is further operably coupled to a shaft 146, wherein the shaft 146 generally extends along the first axis 144 and is operably coupled to the scan arm 138. In the present example, the rotor 140, the shaft 146, and the scan arm 138 are generally fixedly coupled to one another, wherein rotation of the rotor 140 about the first axis 144 generally drives rotation of the shaft 146 and scan arm 138 about the first axis 144, thus generally translating the workpiece 132 along the first scan path 134. Alternatively, the rotor 140, the shaft 146, and the scan arm 138 may be otherwise coupled to one another, wherein the rotation of the rotor 140 and/or shaft 146 may drive an approximate linear translation of the scan arm 138 with respect to the first axis 144, as will be further discussed infra.

In one example, a process medium, such as the ion beam 148 (FIG. 1C), serves as the generally stationary reference, wherein the process chamber 128 is operable to move with respect to the process medium 148, for example, rotate about a second axis 154 (FIGS. 1B, 1D) and angle θ 149. The process medium 148, for example, may be alternatively associated with other semiconductor processing technologies. For example, the process medium 148 may comprise a light source associated with a lithography process. Accordingly, the present invention contemplates any process chamber 128 and process medium 148 operable to be utilized in processing the workpiece 132 (FIG. 1D), whether the process chamber 128 be enclosed, non-enclosed, fixed, or transitory, and all such process chambers and process mediums are contemplated as falling within the scope of the present invention.

In accordance with another exemplary aspect of the invention, the motor 136 comprises a rotor 140 and a stator 142 (FIG. 1D), wherein the rotor 140 and the stator 142 are operable to individually rotate about a first axis 144, and wherein an electromagnetic force between the rotor 140 and the stator 142 generally drives a rotation of the rotor 140 about the first axis 144. For example, a control of the electromagnetic force between the rotor 140 and the stator 142 is operable to selectively drive the rotation of the rotor 140 in a clockwise or counter-clockwise direction about the first axis 144, as will be discussed infra. In another example, the motor 136 further comprises a motor housing 156, wherein the motor housing 156 is generally stationary with respect to the first axis 144. The motor housing 156 in the present example generally encases the rotor 140 and stator 142 and further generally serves as the generally stationary reference for the rotation of the rotor 140 and stator 142. A least a portion of the rotor 140 and stator 142 generally reside within the motor housing 156, however, the motor housing 156 need not enclose the rotor 140 and the stator 142. Accordingly, the rotor 140 and the stator 142 are operable to individually rotate with respect to the motor housing 156, wherein the motor housing 156 is further operable to generally support the rotor 140 and the stator 142 therein. It should be noted that while the present example describes the motor housing 156 as being the generally stationary reference, other generally stationary references may be alternatively defined.

The motor 136, in one example, comprises a brushless DC motor, such as a three-phase brushless DC servo motor. The motor 136, for example, may be sized such that a substantially large diameter of the motor (e.g., a respective diameter of the stator 140, and/or the rotor 142) provides a substantially large torque, while maintaining a moment of inertia operable to provide rapid control of the rotation of the rotor 142. The reciprocating drive system 130 further comprises a shaft 146 operably coupled to the motor 136, wherein in one example, the shaft 146 is fixedly coupled to the rotor 140 and generally extends along the first axis 144 into the process chamber 128. Preferably, the rotor 140 is directly coupled to the shaft 135, as opposed to being coupled via one or more gears (not shown), wherein such a direct coupling maintains a substantially low moment of inertia associated with the rotor, while further minimizing wear and/or vibration that may be associated with the one or more gears.

According to another example, the process chamber 128 comprises an aperture 157 therethrough, wherein the shaft 146 generally extends through the aperture 157 from the external environment 158 to the internal environment 159, and wherein the motor 136 generally resides in the external environment 158. Accordingly, the shaft 146 is operable to rotate about first axis 144 in conjunction with the rotation of the rotor 140, wherein the shaft 146 is generally rotatably driven by the rotor 140 in alternating, opposite directions. In the present example, the shaft 146 may be substantially hollow, thereby providing a substantially low inertial mass. Likewise, the rotor 140 may be substantially hollow, further providing a substantially low rotational inertial mass.

One or more low-friction bearings 150, for example, are further associated with the motor 136 and the shaft 146, wherein the one or more low-friction bearings rotatably couple one or more of the rotor 140, the stator 142, and the shaft 146 to a generally stationary reference 152, such as the housing 146 or the process chamber base 160. The one or more low-friction bearings 150, for example, generally provide a low coefficient of friction between the respective rotor 140, stator 142, shaft 146, and motor housing 156. In another example, at least one of the one or more low-friction bearings 150 may comprise an air bearing (not shown), a liquid field environment, or other bearing known in the art.

In accordance with another exemplary aspect of the invention, the reciprocating drive apparatus 130 is partitioned from the process chamber 128, such that minimum wear and contamination occurs within the internal environment 162. For example, the shaft 146 is generally sealed between the process chamber 128 and the external environment 158 by a rotary seal associated with the shaft and the process chamber, wherein the internal environment 162 within the process chamber is generally isolated from the external environment.

The reciprocating drive apparatus system 160 further comprises a scan arm 138 operably coupled to the shaft 146, wherein the scan arm 138 is operable to support the workpiece 132 thereon. According to another example, the scan arm 138 comprises an elongate arm 164 extending radially from the first axis 144, wherein the elongate arm 164 is generally fixedly coupled to the shaft 146, wherein the rotation of the shaft 146 about the first axis generally translates the workpiece 132 with respect to the first axis 144. In one example, the scan arm 132 is coupled to the shaft 146 at a center of gravity of the scan arm 132, wherein the scan arm 132 is substantially rotationally balanced about the first axis 144. In another example, the scan arm 132 is comprised of a light weight material, such as magnesium or aluminum.

The scan arm 138 may further comprise an end effector 135 operably coupled thereto, whereon the workpiece 132 is generally supported thereon. The end effector 135, for example, comprises an electrostatic chuck (ESC) or other workpiece clamping device is operable to selectively clamp or maintain the workpiece 132 with respect to the end effector 135. The end effector 135 may comprise various other devices for maintaining a grip of the workpiece 132, such as a mechanical clamp or various other retaining mechanisms as may be known by those of ordinary skill in the art, and all such devices are contemplated as falling within the scope of the present invention.

In another example, the scan arm 138 may further comprise a counterweight 166 operably coupled thereto, wherein the counterweight 166 generally balances a mass of the scan arm 138, end effector 135, and the workpiece 132 about the first axis 144. Such a counterweight 166 may advantageously assist in centering the mass moment of inertia of the scan arm 138 about the first axis 144, thus dynamically balancing the scan arm 138 about the first axis 144. Accordingly, the scan arm 138, shaft 144, rotor 140, and stator 142 are generally dynamically balanced about the first axis 144, thus generally eliminating side load forces, other than gravitational forces. The counterweight 166, for example, may be comprised of heavier metal than the scan arm 138, such as steel.

In the case where the reciprocating drive apparatus 130 of the present invention is utilized in an ion implantation system, the reciprocating drive apparatus 130 may further comprise a load lock chamber/air management system 104 associated with the process chamber 128, wherein scan arm 138 is further operable to rotate and/or translate the end effector 135 to the load lock chamber/AMS 104 in order to insert or remove workpieces 132 to or from the process chamber. Furthermore, a Faraday cup 167 is provided within the process chamber 138 and positioned within a path of the ion beam 148, wherein the Faraday cup 167 is operable to generally sense a beam current associated with the ion beam 148. Accordingly, the sensed beam current can be utilized for subsequent process control.

According to another exemplary aspect, the end effector 135 may be rotatably coupled to the scan arm 138 about a second axis 160, wherein the end effector 135 is operable to rotate about the second axis. An end effector actuator 170 may be operably coupled to the scan arm 138 and the end effector 135, wherein the end effector actuator 170 is operable to rotate the end effector 135 about the second axis 168. The second axis 168, for example, is generally parallel to the first axis 144, wherein the process chamber 128 may be operable, for example, to selectively rotate the workpiece 132 relative to the ion beam 148 to vary the so-called "twist angle" of implant, as will be understood by those of ordinary skill in the ion implantation art. The process chamber 128 can be rotated about the third axis 172, an angle θ 149, for example, forty five degrees (45°) to implant the workpiece 132 at that angle as illustrated in FIGS. 1B and 1C. Alternatively, the rotatable coupling of the end effector 136 to the scan arm 138 may be utilized to maintain a rotational orientation (e.g., a rotational orientation 174 of FIG. 1E) of the workpiece 136 with respect to the ion beam 148 by continuously controlling the rotation of the end effector 135 about the second axis 154. The end effector actuator 176 of FIG. 1D may comprise a motor (not shown) or mechanical linkage (not shown) associated with the scan arm 138 operable to maintain the rotational orientation of the workpiece 132 with respect to the ion beam 148. Alternatively, the end effector actuator 176 may comprise a pivot mount (not shown) associated with the second axis 154 (240), wherein inertial forces associated with the workpiece 132 are operable to maintain the rotational orientation of the workpiece 132 with respect to the ion beam 148. Maintaining the rotational orientation of the workpiece 132 with respect to the ion beam 148 is advantageous when the ion beam 148 impinges on the workpiece 132 at a non-orthogonal angle θ 149, and/or when a crystalline or other structure associated with the workpiece (e.g., a semiconductor substrate, or a substrate having structures formed thereon) plays a role in the uniformity of the ion implantation.

According to another aspect of the present invention, a robot 112 can pick up a workpiece from a storage component (not shown) in the first zone 108 and translate it into a second zone 110. The robot 112 can be stationary or it can translate along a linear or curvilinear path (not shown). The workpiece can be grasped utilizing robotic arms 114 that are able to translate or rotate, as is well known by those of ordinary skill in the art.

Referring now to FIG. 1E an exemplary rotation 178 of the shaft 146 about the first axis 144 of FIG. 1D is illustrated, wherein the scan arm 138, end effector 135, and workpiece 132 are further rotated about the first axis 144. Accordingly, the workpiece 132 can be reciprocally translated along a first scan path 180 with respect to the ion beam 148 (e.g., via one or more cyclical counter-rotations of the shaft 146 about the first axis 144), wherein the ion beam 148 of FIGS. 1B, 1C and 1D is illustrated as going into the page of FIG. 1E. The rotation 178 (and counter-rotation) of the shaft 146 about the first axis 144 can be advantageously controlled in order to oscillate or reciprocate the end effector 135 along the first scan path 180 in a uniform manner, as will be discussed hereafter. FIG. 1E further illustrates a rotation 178 of the end effector 135 about the second axis 154 as discussed above, wherein the rotation 178 of the end effector 135, and hence, the workpiece 132, about the second axis 154 can be further controlled in order to maintain the rotational orientation 174 of the workpiece 132 with respect to the first axis 144 or ion beam 148 (e.g., rotational orientation of the workpiece 132 with respect to the ion beam 148 is indicated by a triangle 174 that is fixed with respect to the workpiece 132).

In order to evenly process the workpiece 132, such as providing an even implantation of ions into the workpiece 132 from the ion beam 148, it is important to maintain a generally constant translational velocity of the end effector 135 when the workpiece 132 is subject to the ion beam 148 while traveling along the first scan path 180. Maintaining a generally constant velocity of the end effector 135 while the workpiece 132 passes through the ion beam 148, for example, provides a generally uniform dose of ions to the workpiece 132, thus evenly processing the workpiece 132 as it travels along the first scan path 180 in a pendulum-type motion.

Therefore, in one embodiment, a generally constant velocity is desired for a predetermined scanning range 182 associated with the movement of the workpiece 132 through the ion beam 148. The predetermined scanning range 182 is generally associated with the physical dimensions of the workpiece 132 (e.g., greater than a diameter D of the workpiece). In the present example, the predetermined scanning range 184 is generally defined by the workpiece 132 traveling a distance greater than a total of the diameter D of the workpiece plus a width of the ion beam 148, wherein the workpiece 132 travels through the ion beam 148 along the first scan path 180, and wherein the ion beam 148 is relatively scanned between opposite ends 184 of the workpiece.

According to another embodiment, a desired velocity profile for the workpiece 132 within the predetermined scanning range 182 may be defined, wherein the desired velocity profile generally depends on a configuration of the reciprocating drive apparatus 130. For example, depending on whether the workpiece 132 is fixed or rotatable with respect to the scan arm 138, a respective generally constant velocity or a variable velocity of the rotation 178 of the scan arm (and thus, a respective generally constant or variable velocity of the workpiece 132 along the first scan path 180) may be desired. If, for example, the workpiece 132 is rotated with respect to the scan arm 138 in order to maintain the rotational orientation 174 along the first scan path 180, the rotational velocity of the scan arm about the first axis 144 may be varied when the ion beam 148 nears ends 184 of the predetermined scanning range 182 (e.g., an increase in velocity by about 10% near the ends 184 of the predetermined scan range 184) in order to provide a generally uniform dose of ions to the workpiece 132 along the curvilinear path 178. As another alternative, or in addition to varying the velocity of the scan arm 138, properties of the ion beam 148, such as the ion beam current, can be varied in order to produce a generally uniform dosage of ions to the workpiece 132.

Figure 2A:
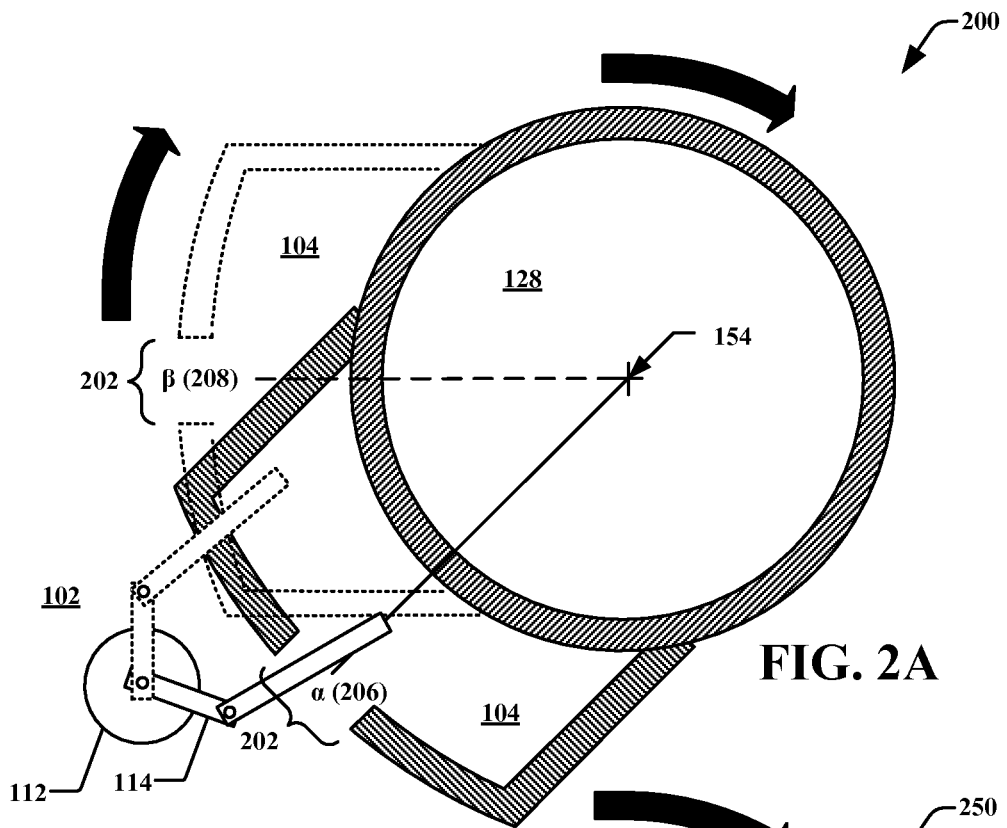
FIG. 2A is a top cross sectional view of a process chamber with an airflow management system in accordance with another aspect of the present invention.
Figure 2B:
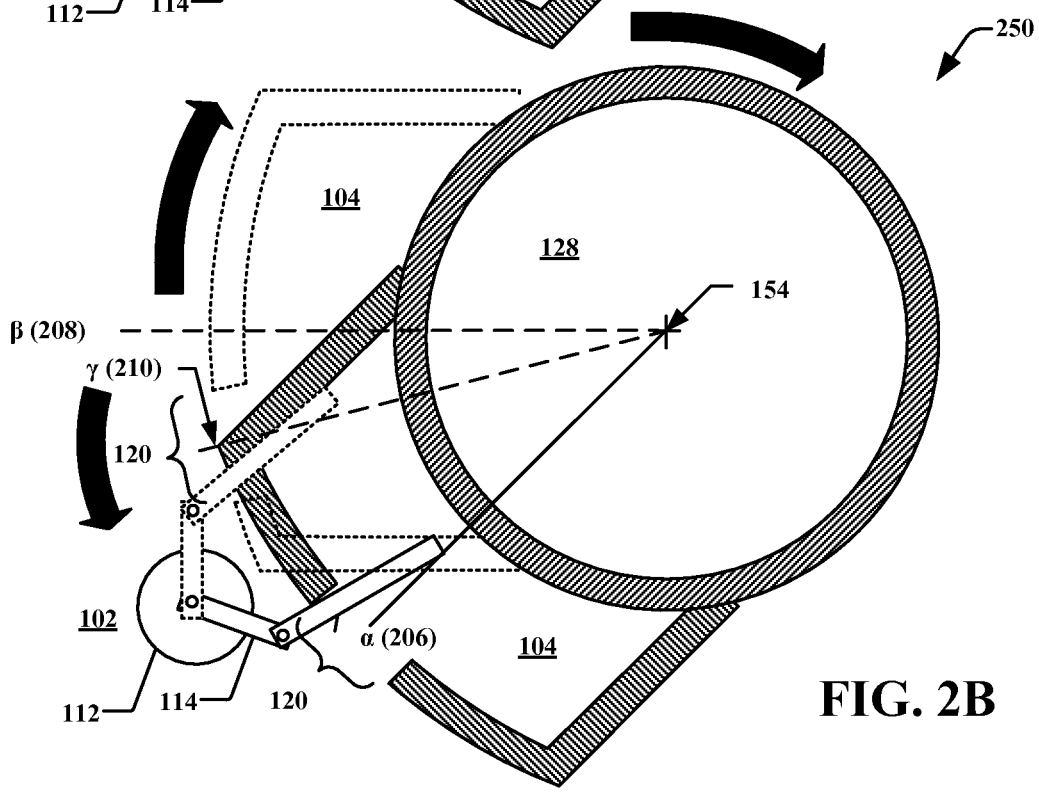
FIG. 2B is a top cross sectional view of a process chamber with an airflow management system and a movable air diffuser according to an aspect of the invention.

FIGS. 2A and 2B illustrate simplified views of an exemplary process chamber system 200 and 250, respectively operable to rotate the process chamber 128 around a process chamber axis 204. It should be noted that the main difference between FIG. 2A and FIG. 2B is that the air diffuser 202 of FIG. 2A is illustrated as a fixed or stationary air diffuser 202, whereas the air diffuser 120 of FIG. 2B is a moving air diffuser 120 illustrated to provide an upper-level understanding of the invention, and is not necessarily drawn to scale. Accordingly, various components may or may not be illustrated for clarity purposes. It shall be understood that the various features illustrated can be of various shapes and sizes, or excluded altogether, and that all such shapes, sizes, and exclusions are contemplated as falling within the scope of the present invention.

As implied by the use of the term "moving air diffuser", in one example, the process chamber 128 of the present invention, illustrated in FIGS. 2A and 2B are operable to rotate about the process chamber axis 154, such that the workpiece rotates with respect to a generally stationary ion beam, wherein the apparatus can be utilized with an air management system 104 in an ion implantation process, as will be discussed hereafter in greater detail. Alternatively, the air management system 104 and the moving air diffuser 120 may be utilized in conjunction with various other processing systems, which may include other semiconductor manufacturing processes such as, for example, a step-and-repeat lithography system. In yet another alternative, the air management system 104 can be utilized in various processing systems not related to semiconductor manufacturing technology, and all such systems and implementations are contemplated as falling within the scope of the present invention.

According to one aspect of the present invention, the process chamber 130 of FIGS. 2A and 2B is driven by a motor operably coupled to a gearbox wherein the motor is further operable with a spur gear, for example, to rotate the process chamber, thereon. The air diffuser 202 of FIG. 2A is fixedly attached, for example, to the air management system 104 which is attached to and rotates with the process chamber 128. In other words, in FIG. 2A, the process chamber 128, the air management system 128, and the air diffuser 202 are generally fixedly coupled to one another, wherein rotation of the process chamber 128 about the axis 204 generally drives rotation of the AMS 104 and the air diffuser 202 about the axis 204. As illustrated in FIG. 2A, the center of the air diffuser 202 initially starts out at angle α 206 which in this example is zero degrees (0°), for example. A customer may request an ion implantation angle of forty five degrees (45°) as described supra. When the process chamber 128 in FIG. 2A is rotated clockwise forty five degrees (45°) (angle β 208) the air management system 104 and the air diffuser 202 rotate clockwise forty five degrees (45°), as well.

FIG. 2A illustrates a robot 112 having a robotic arm 114 for loading workpieces between an equipment/environmental front end module (EFEM) 102 and AMS 104, that were described in detail supra. As illustrated, the robot is able to load the workpieces when the process chamber is at angle α (0°) however the robot 112 is unable to load workpieces at angle β (45°) because the air diffuser 202, the interface opening between the EFEM 102 and the AMS 104, is too far away. In this case the process chamber has to be rotated counterclockwise from angle β 208 to a predetermined angle that is less than angle β 208 and greater than or equal to angle α 206. This additional movement of the process chamber 128 increases cycle times or the need for additional robots, for example, at a time when manufacturers are being driven to reduce cycle times for processing wafers and manufacturers want to limit the floor space allocated to robotics, process chambers and the like. Therefore a need clearly exists to reduce cycle time and allocated equipment space.

Alternatively, the system 250 illustrated in FIG. 2B meets the goals outlined above utilizing a moving air diffuser 120, as will be further discussed infra. FIG. 2B is a simplified top cross-sectional view of an exemplary process chamber system 250 similar to the one shown in FIG. 2A, however, the air diffuser 120 is mechanically coupled to the process chamber 128 so that they rotate in opposite directions to each other. The mechanical coupling can be executed using a belt drive, a gear train, a mechanical linkage and the like. As seen in FIG. 2B, the air diffuser 120 is generally integral to an air transfer system 104, wherein the air diffuser 120 is generally configured to translate along a path allowing a process chamber to rotate relative to the equipment front end module. The translation in this embodiment is along an arcuate path, however any path is contemplated within this invention, for example, a linear path, a sinusoidal path, a predefined path, etc. The air diffuser 128 further comprises vanes 124 that are shaped and generally positioned to direct airflow in a controlled manner from the outside to the inside of the AMS 104 illustrated in FIG. 2A. The air diffuser 120 is further configured with a moveable linkage configured to drive the air diffuser 120 in the direction opposite of the direction the process chamber 128 is being driven, for example.

As illustrated in FIG. 2B, the process chamber starts out, for example, at angle α (0°) and is rotated 45° clockwise, wherein the air diffuser 120 is driven counterclockwise 22.5°, for example. As illustrated in FIG. 2B, in contrast to system 200 in FIG. 2A, a robot 112 can load a workpiece into the air management system 104 when the process chamber 128 has been rotated clockwise 450 because the air diffuser 120 has rotated counterclockwise 22.5°, for example. In yet another alternative, the air diffuser 120 can be designed so that the air diffuser 120 rotates in the direction opposite of the process chamber 128 by the same number of degrees, or in various ratios, and the like. The ratio of the relative angular movement of the process chamber 128 and the air diffuser 120 can be adjusted by adjusting the gearing ratio, for example. Of course, those skilled in the art will recognize many modifications may be made to this configuration, without departing from the scope or spirit of what is described herein, and all such systems and implementations are contemplated as falling within the scope of the present invention.

Figure 2C:
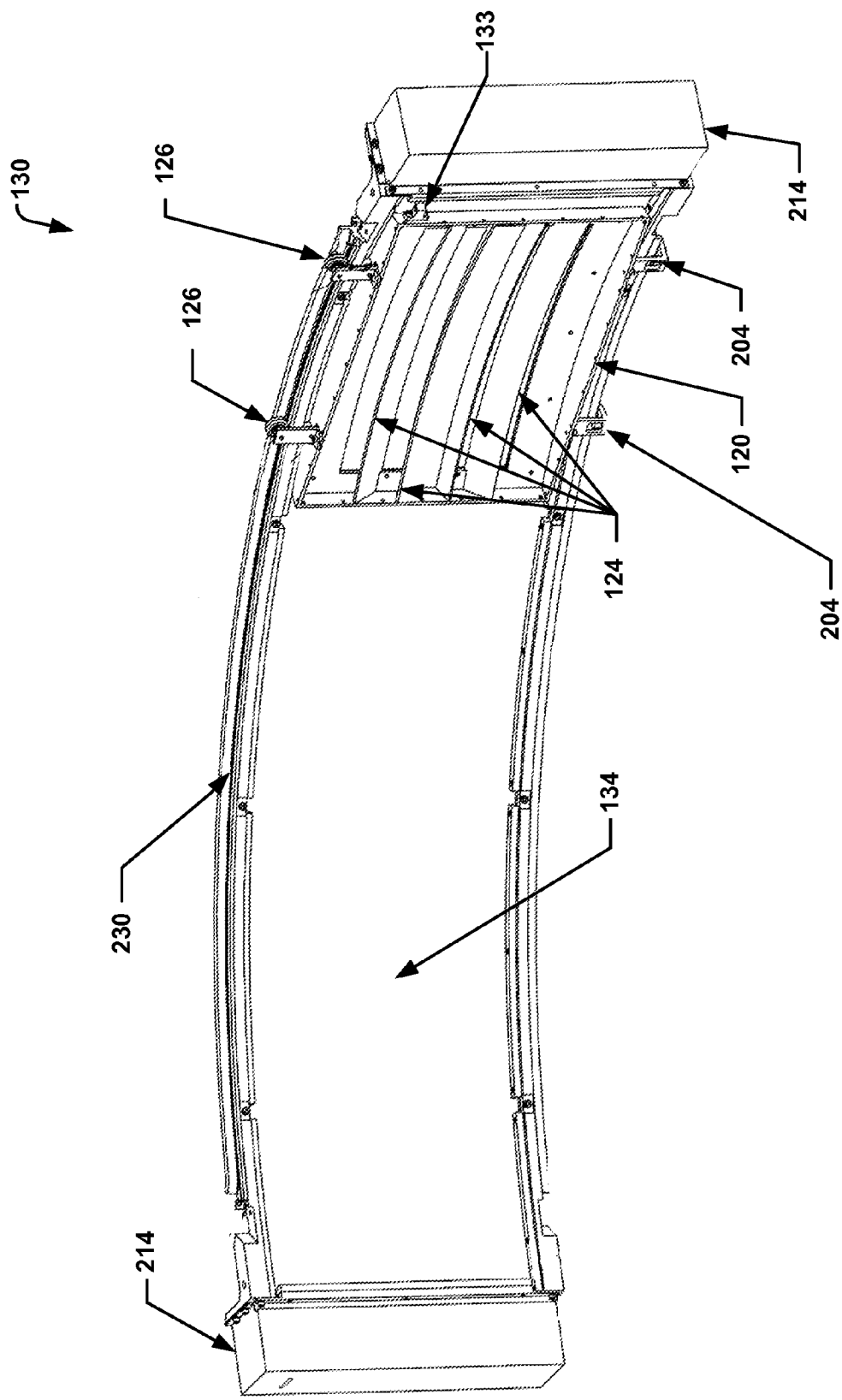
FIG. 2C is a back perspective view of an interface panel with a movable diffuser in accordance with another aspect of the invention.

FIGS. 2C, 3, 4, 5 and 6 illustrate various views of the exemplary interface panel 120 of FIG. 1A. The interface panel 120 is shown in greater detail, wherein further exemplary aspects of the present invention can be appreciated. FIG. 2C illustrates a top front perspective view, wherein the interface panel 120 and a moving air diffuser 106 are illustrated, wherein the moving air diffuser 106 and the interface panel 260 are coupled to each other via respective vee wheels 126 (FIG. 5) and cam followers 204, wherein the wheels 126 translate along an arcuate track 230. The vee wheels 126 and cam followers 204, for example, are configured to rotate thereby translating the air diffuser 106 along the same arcuate path. The air diffuser 106 is connected to movable shields 134 on both sides of the diffuser 106. The moveable shields 134 are preloaded in tension wherein the shield 134 is either pulled out of or retracted into a shield housing(s) 214. Thus, the air diffuser 106 is movable about the interface panel 260 therein allowing access of a robotic arm from outside the air management system to enter the air management system illustrated in FIG. 1A after the process chamber 128 has been rotated. The shield 134 prevents air from passing through the interface panel 134 at locations where the shield 134 is located, for example. One or more motors, linkages or other force-producing mechanisms (not shown) may be further operably coupled to one or more of the interface panels 120 and the process chamber 128, wherein controlled rotation of the process chamber 128 and the moving air diffuser 106 may be attained. For example, the controller 151 of FIG. 1D may be further configured to selectively position (e.g., rotate or translate) the process chamber 128 thirty five degrees (35°) clockwise and air diffuser 120 thirty five degrees (35°) counterclockwise (e.g., by controlling the motor(s) coupled to the linkage), therein generally controlling the position of the air diffuser 106 relative to the stationary robot, for example. FIG. 3 illustrates a front view of the interface panel 300 illustrated in FIG. 2C, for example. FIG. 5 is a section view B-B as illustrated in FIG. 4. The vee wheel 126 is illustrated, wherein the vee wheel 126 rides on and is "captured" by the track 230, for example. The vee wheel 126 can be flexibly held in place using a modified shoulder screw 235 preloaded with disc springs 231 and 232, for example that are well known by those of ordinary skill in the art. It is to be appreciated that the interface panel 120 can be constructed in numerous ways, for example, utilizing folding panels, motors and wireless communication, and the like.

Figure 7A:
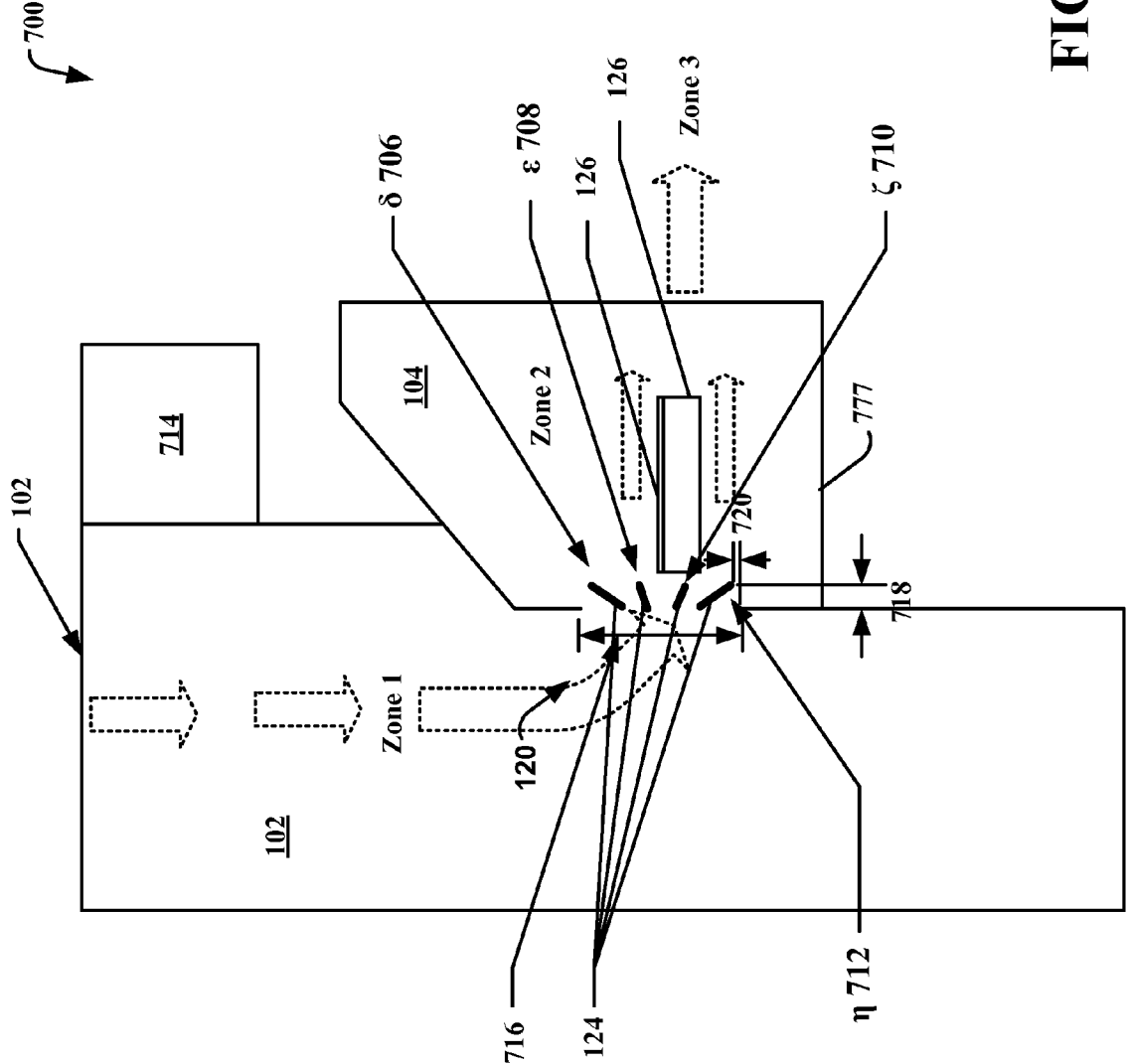
FIG. 7A is a cross-sectional side view of the equipment front end module and the air management system in accordance yet another aspect of the invention.

FIG. 7A illustrates an exemplary air management system 700 discussed above, wherein the air management system 700 comprises an interface panel and a moving air diffuser 120 of FIG. 2C, for example. The diffuser 120 comprises vanes 124, for example, configured to direct air entering the EFEM 102 from a fan unit 714 at the upper end of the EFEM 102, wherein the air (e.g., illustrated as a dashed arrows) is directed through the air diffuser 120 by vanes 124 that direct the air over a platen 126, wherein particles and/or contaminants are directed away from the workpiece 132. In one embodiment, a first vane can be set at sixty degrees (60°, angle δ), to horizontal, the second vane can be set at twenty five degrees (60°, angle ε) to horizontal, a third vane can be set at minus sixty degrees (−60°, angle ζ), and the fourth vane may be set to minus twenty five degrees (−25°, angle η). The height of the opening 716 can be fabricated to 305 mm, for example, with the dimensions for the fourth vane 718 and 720, as shown. As illustrated the dimension 718 is 40 mm and the dimension is 20 mm, for example. It is to be appreciated that of course, those of ordinary skill in the art will recognize many modifications may be made to this configuration, without departing from the scope or spirit of what is described herein, for example, six vanes, equal vane angles, etc. In addition other fluids than air are contemplated e.g., nitrogen, and the like in the present invention and may be utilized with other types and configurations of air management systems 104 without departing from the spirit and the scope of the invention.

Figure 7B:
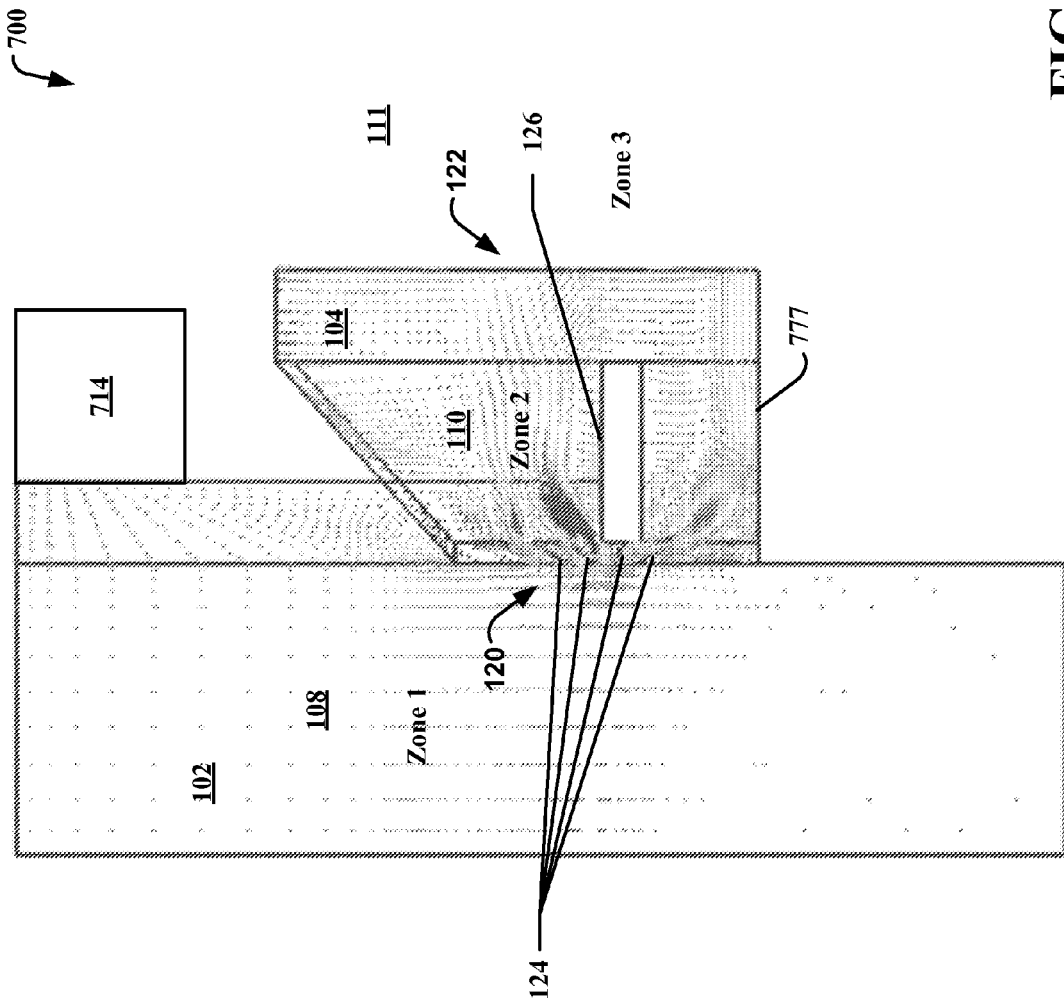
FIG. 7B is a cross-sectional view of airflow within the equipment front end module and the air management system in accordance with another aspect of the present invention.

FIG. 7B illustrates a cross-sectional view of the environmental front end module 102 as it interfaces with the air management system 104. A moving air diffuser 120 is comprised of vanes 124 that are optimized to re-circulate air above the workpiece so that contaminants, coming in contact with the workpiece in Zone 2 (110), are minimized. A fan unit 714 supplies clean air to be EFEM 102 that passes through the air diffuser 120 and over at a workpiece platen 124 which then exits the air management system 104 through an adjustable damper 122. FIG. 7B illustrates a flow optimization that was performed using a flow simulation, for example. The pressure between Zone 1 (108), Zone 2 (110) and Zone 3 (111) is maintained to ensure a desired air flow velocity of air that is well-known by one of ordinary skill in the art.

Figure 7C:
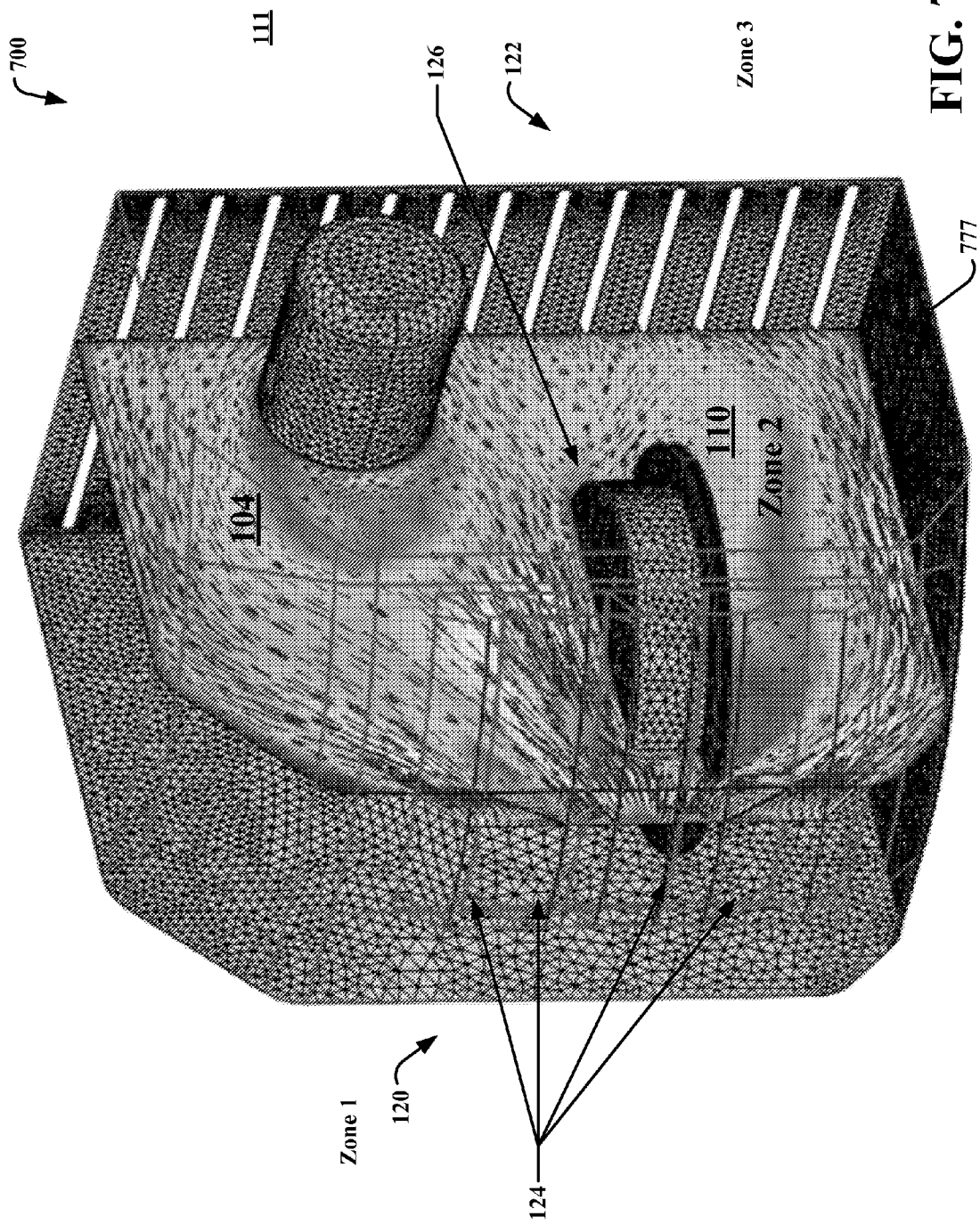
FIG. 7C is a cross-sectional view of the airflow within the air management system in accordance with still another aspect of the present invention.

FIG. 7C illustrates a semi-transparent cross-sectional view of an air management system 104. A moving air diffuser 120 is comprised of vanes 124 that are optimized to re-circulate air above the workpiece so that contaminants, coming in contact with the workpiece in Zone 2 (110), are minimized. A fan unit supplies clean air that passes through the air diffuser 120 and over at a workpiece platen 124 which then exits the air management system 104 through an adjustable damper 122. FIG. 7C illustrates a flow optimization that was performed using a flow simulation, for example. The FIG. 7C illustrates that the flow of air over the top of the platen 124 is basically laminar which tends to drive contaminants away from the workpiece. The air flow/pressure tests agree with Computational Fluid Dynamics (CFD) models as a good approximation to be described infra.

Figure 8:
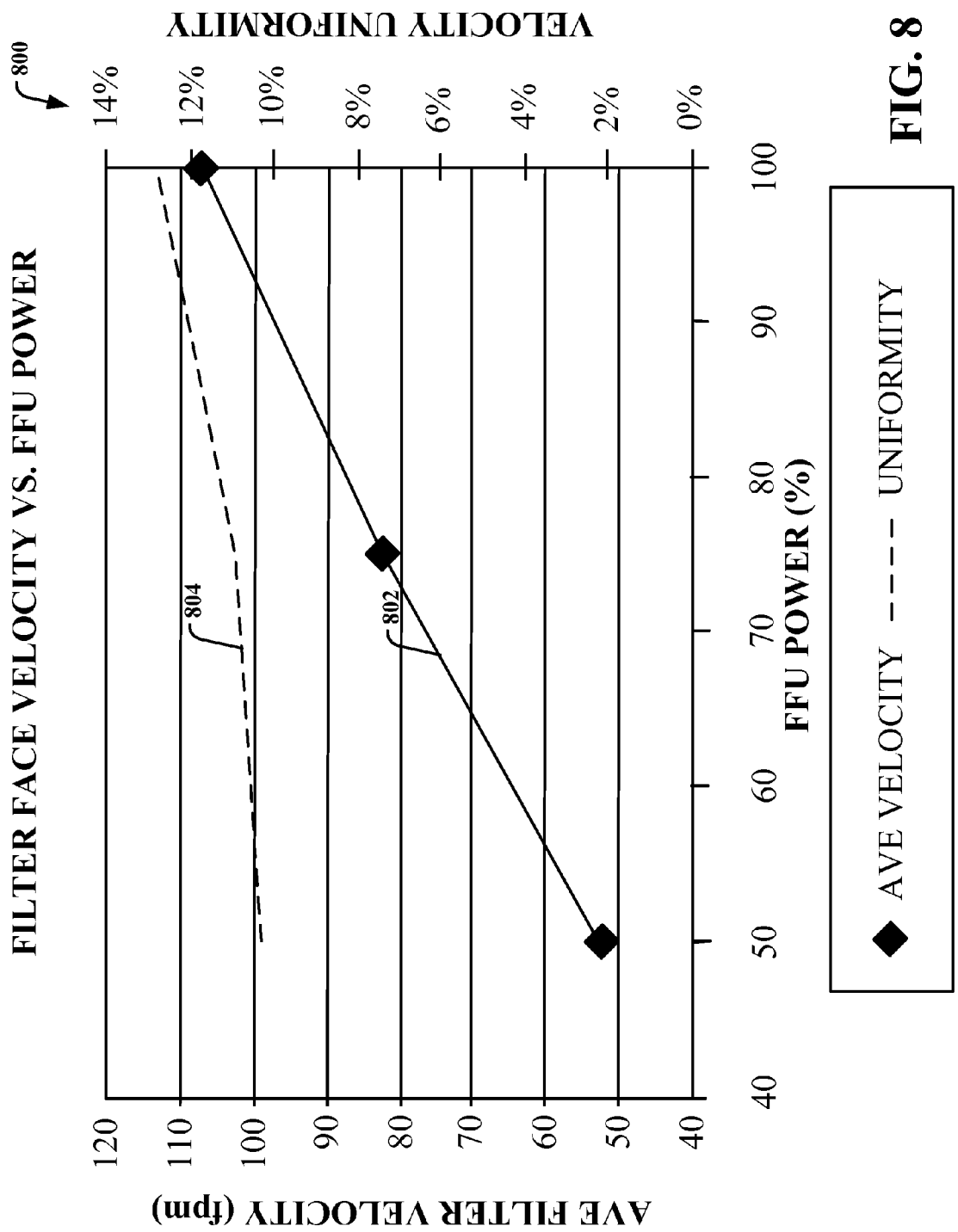
FIG. 8 is a graph of the average the filter of velocity versus the fan filter units power, in accordance with an aspect of the present invention.
Figure 9:
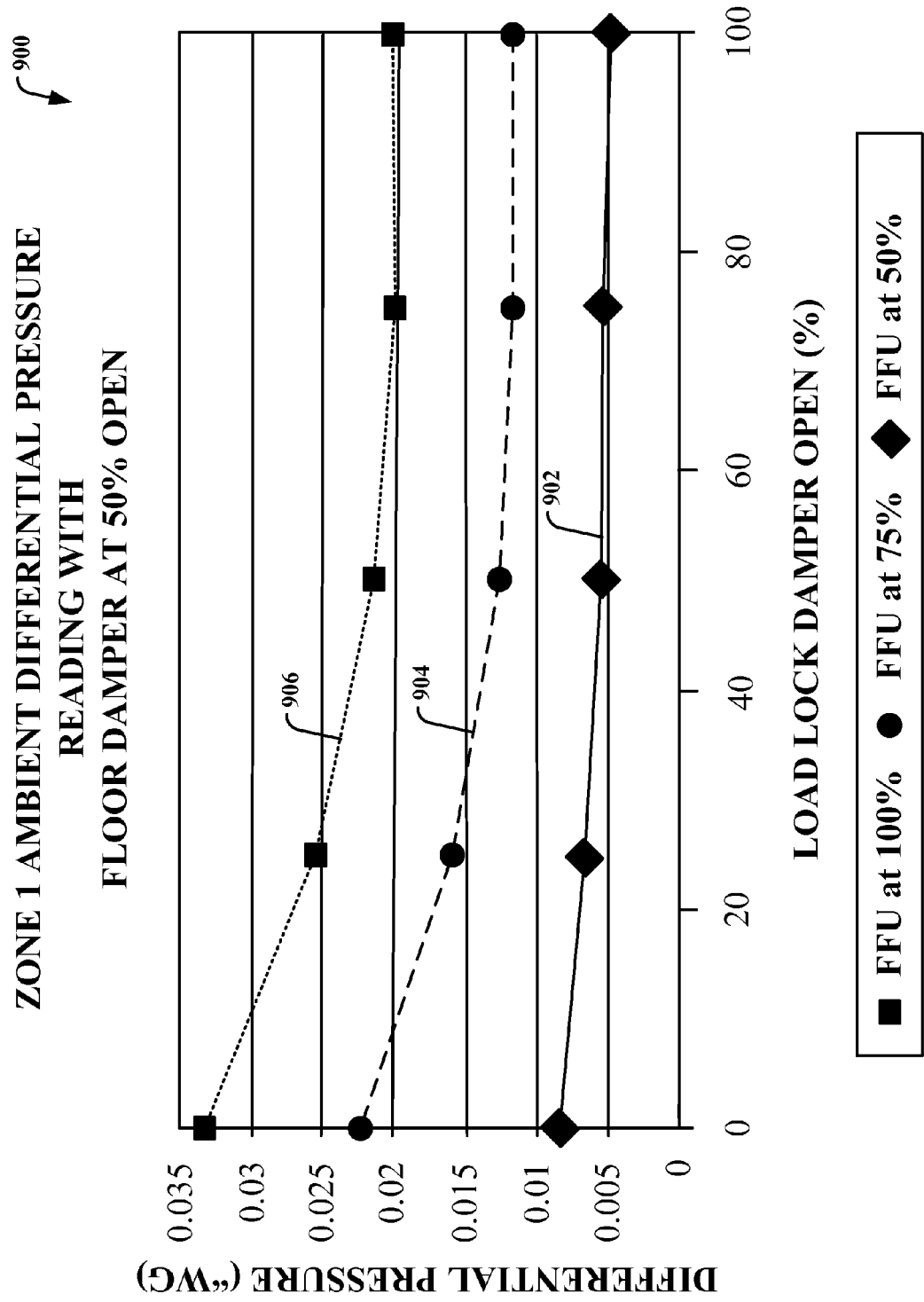
FIG. 9 is a graph of differential pressure versus the load lock damper opening percentage, according to yet another aspect of the present invention.
Figure 10:
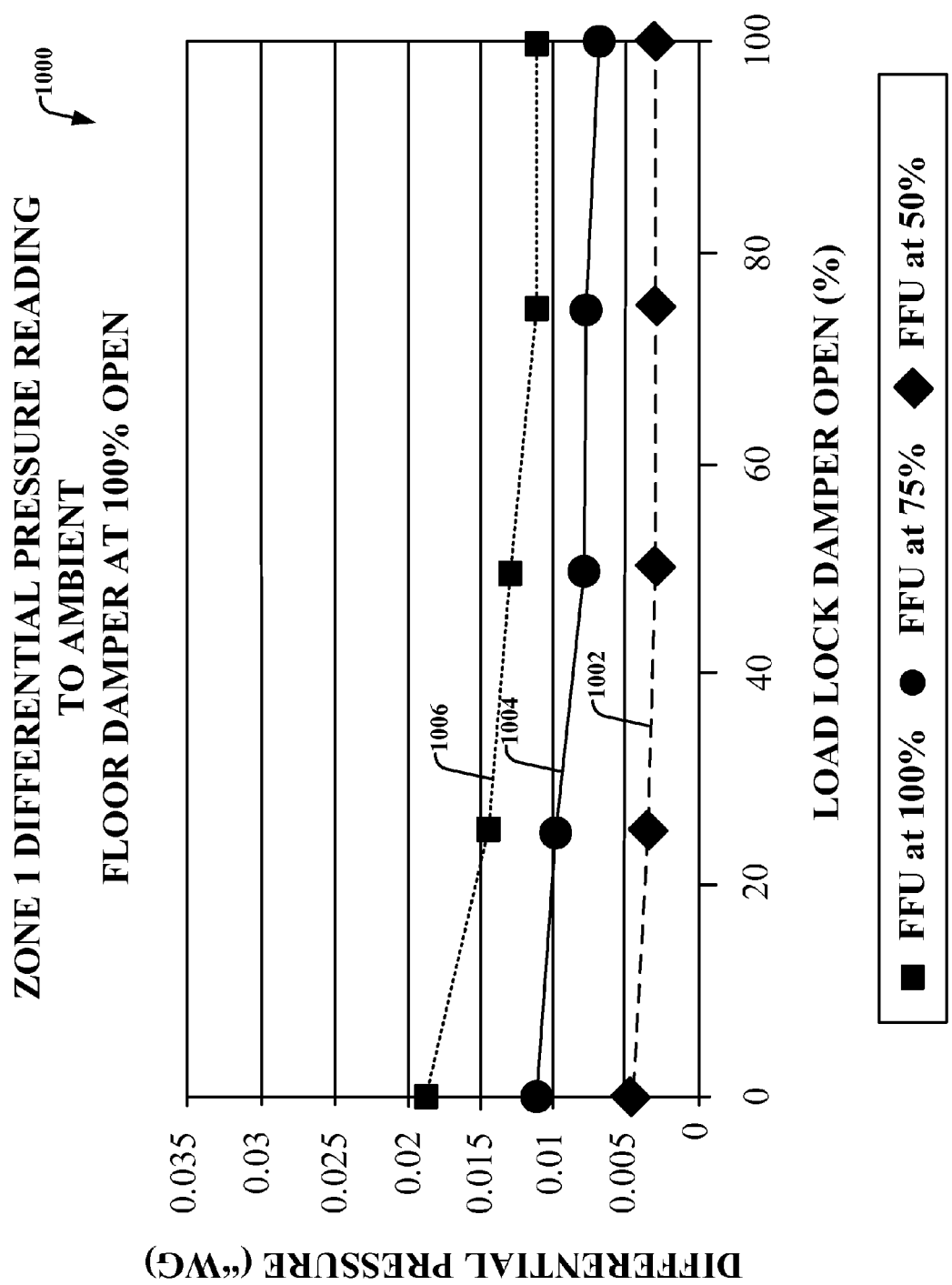
FIG. 10 is a graph of differential pressure versus load lock damper opening with lower damper opened at 100%, in accordance with yet another aspect of the present invention.
Figure 11:
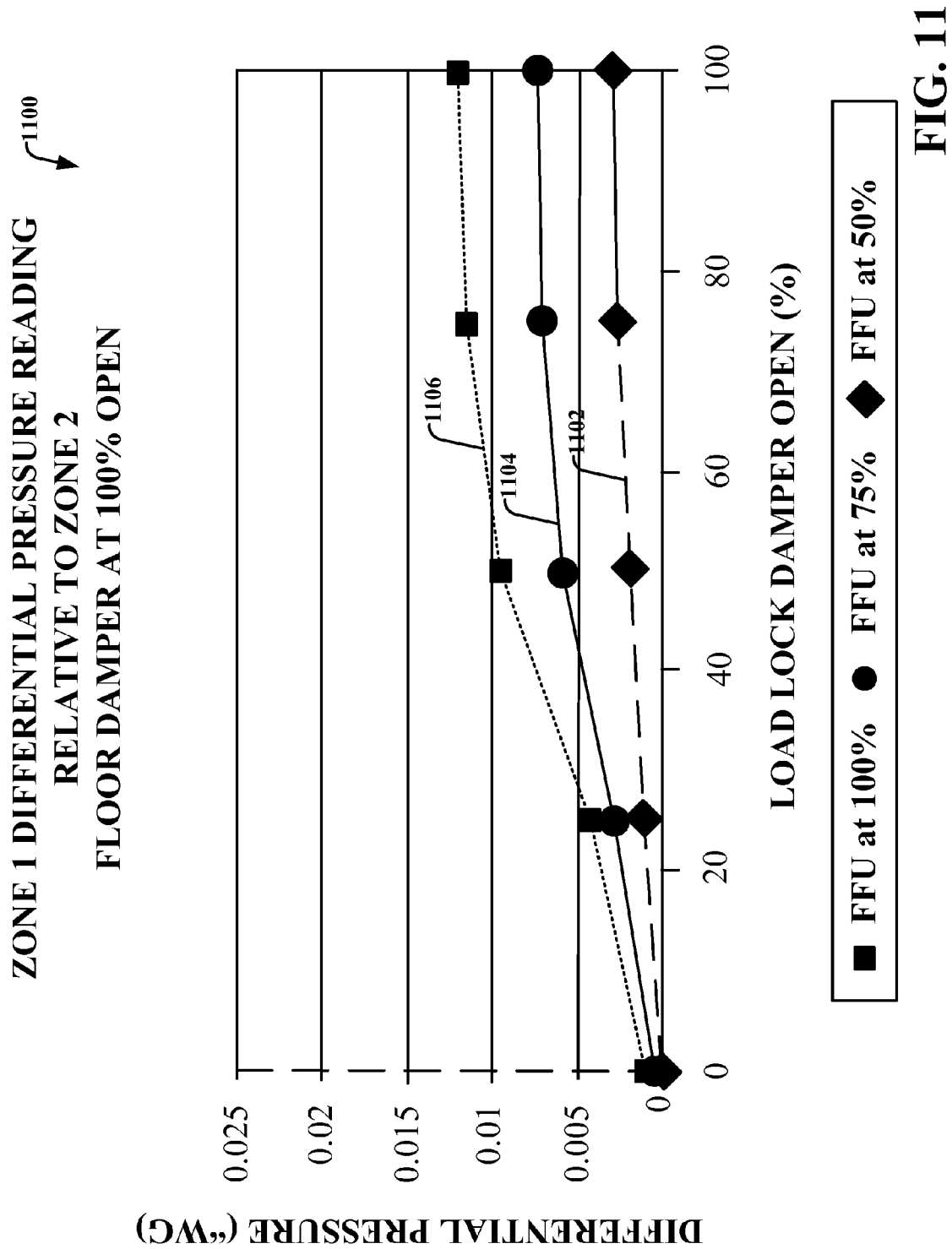
FIG. 11 is a graph of Zone 1 differential pressure relative to Zone 2 differential pressure with the floor damper opened 100%, in accordance with still another aspect of the present invention.

Referring to FIG. 8, in one embodiment of the present invention, is a graph at 800 that illustrates representative filter face velocities that were obtained, comparing both average filter velocity (fpm) and velocity uniformity (%) vs. fan filter units power (%). The graph illustrates the data, as plotted on a linear x-axis, and a linear y-axis. The graph 800 includes two different exemplary groupings of curves 802 and 804, the first curve 802 was obtained by fixing the fan filter unit power at three different levels (e.g., 50%, 75% and 100%) of capacity. The average filter velocity was measure at each of those power levels. The second curve 804 is representative three data points plotted based on velocity uniformity at the three power points discussed supra.

For example, it can be seen in the curve 802; the system can deliver a maximum of approximately 112 fpm average velocity. Also it is apparent that at approximately 90% of the FFU power and above the velocity uniformity is approximately about 10% or less which meets specification to prevent air flow recirculation.

In yet another test, according to one embodiment of the present invention, three groups of data 902, 904 and 906 were obtained for an air management system, as shown in FIG. 7C as a graph 900, for example. The graph illustrates Zone 1 (110) to ambient (111) differential pressure, utilizing a floor damper 777 (e.g., FIG. 7C), for example, that is open 50%. The curves 902, 904, and 906 illustrate the differential pressure (wg) obtained with the fan filter unit 714 (FIG. 7B) at 100%, 75% and 50%, respectively and the damper open at 0%, 25%, 50%, 75%, and 100%. Data 902 illustrates that with the floor damper 50% open and the load lock damper closed (0%).

According to another embodiment a test, three groups of data 1002, 1004 and 1006 were plotted for an air management system, as shown in FIG. 7C as a graph 1000, for example. The graph illustrates Zone 1 (110) to ambient (111) differential pressure, utilizing a floor damper 777 (e.g., FIG. 7C), for example, that is open 100%. The curves 1002, 1004, and 1006 illustrate the differential pressure (wg) obtained with the fan filter unit 714 (FIG. 7B) at 100%, 75% and 50% power, respectively and the damper open at 0%, 25%, 50%, 75%, and 100%. Data 902 illustrates that with the floor damper 50% open and the load lock damper closed (0%). FIGS. 9 to 14 defines the range the tool operation which a desirable flow across the diffuser could be maintained.

Figure 12:
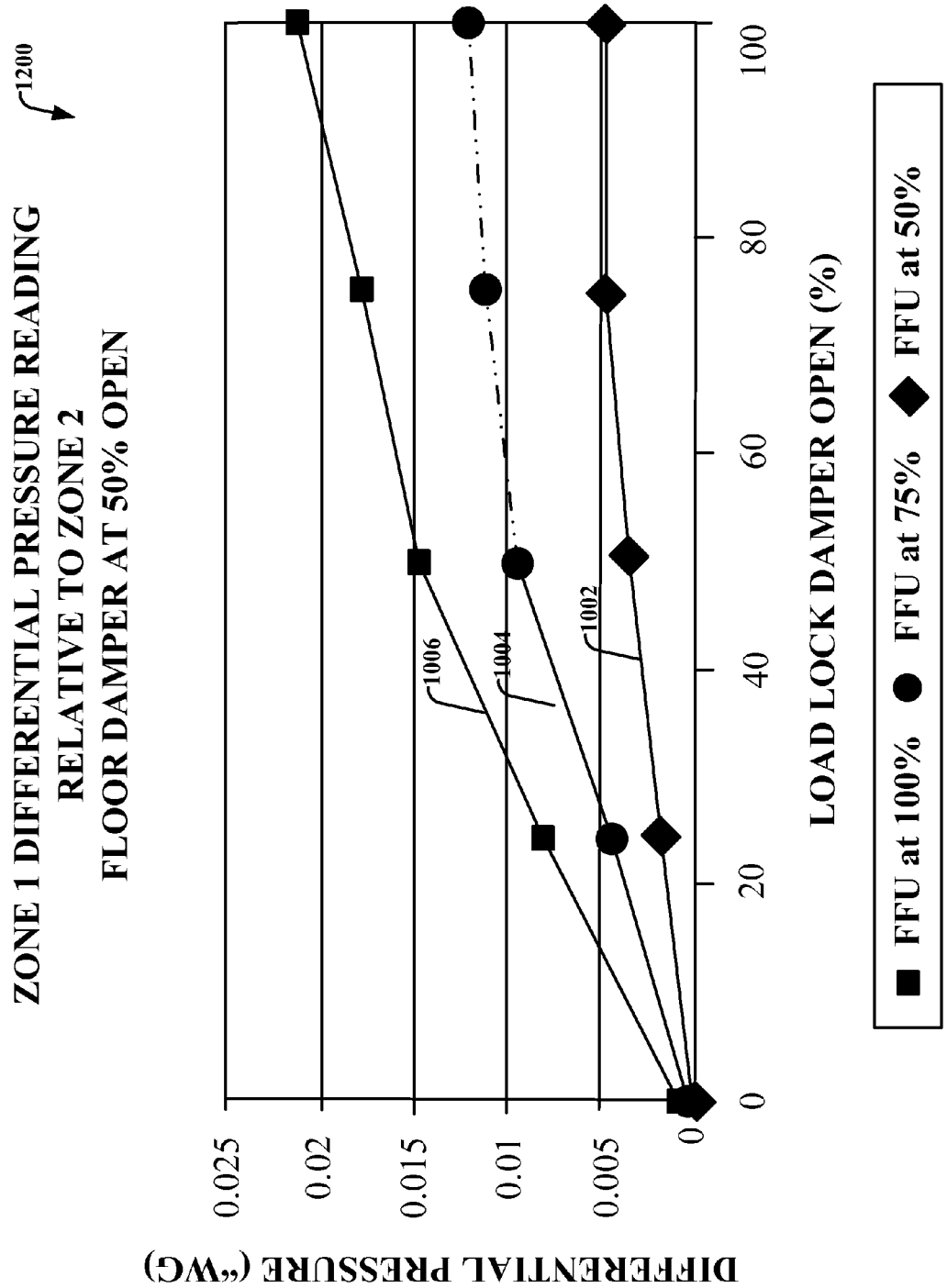
FIG. 12 is a graph of Zone 1 differential pressure relative Zone 2 with the floor damper opened at 50%, in accordance with another aspect of the invention.

In yet an additional test, according to yet another embodiment of the present invention, three groups of data 1102, 1104 and 1106 were attained for graph 1100 for an air management system, as discussed supra. The graph 1000 illustrates Zone 1 (110) to Zone 2 (108) differential pressure, utilizing a floor damper 777 (e.g., FIG. 7C), for example, that is 100% open. The curves 1102, 1104, and 1106 illustrate the differential pressure (wg) obtained with the fan filter unit 714 (FIG. 7B) at 100%, 75% and 50%, respectively and the load lock damper open at 0%, 25%, 50%, 75%, and 100%. FIG. 12 illustrates data similar to the data in FIG. 11 except the floor damper is set at 50% open.

Figure 13:
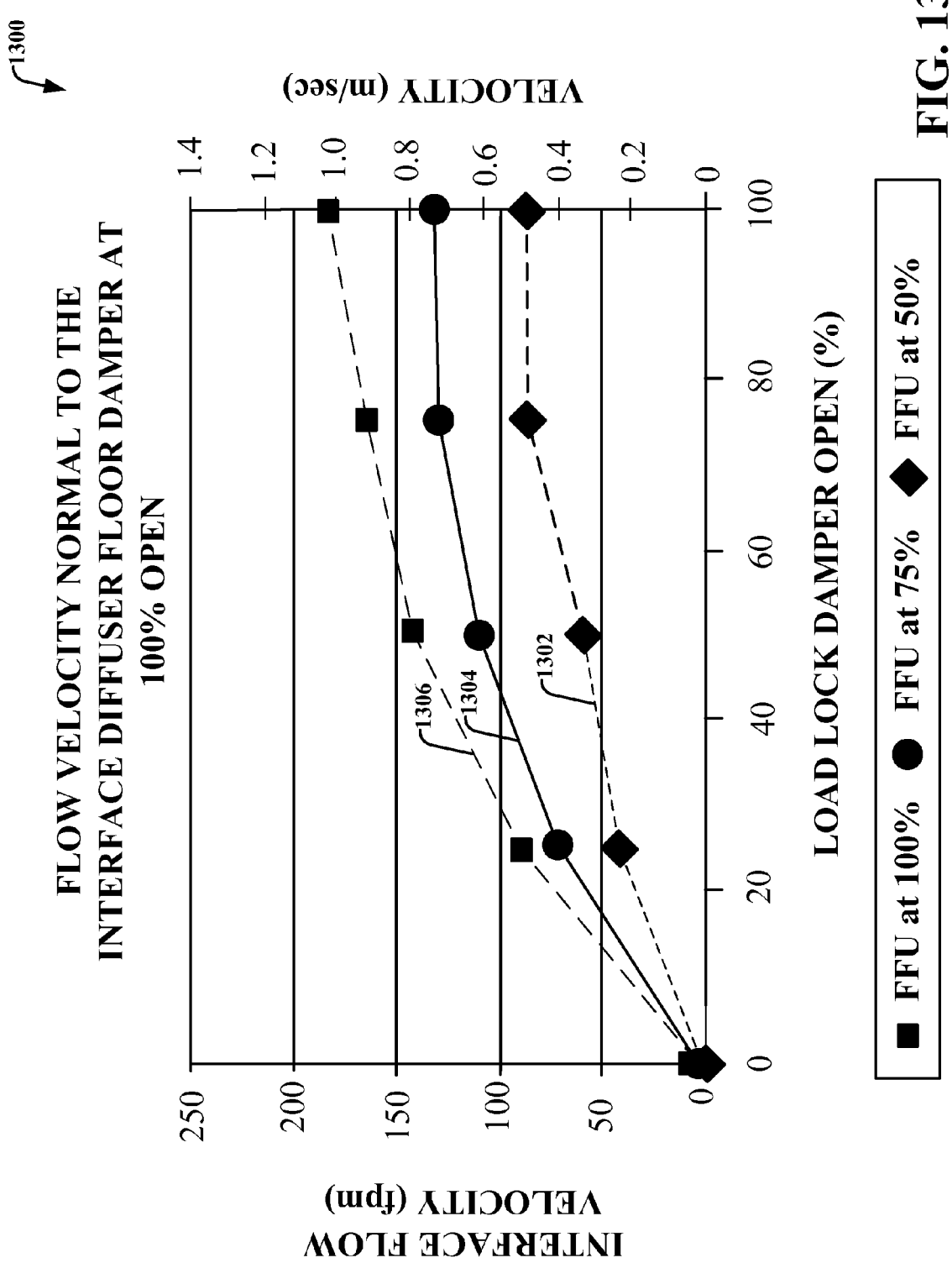
FIG. 13 is a graph of flow velocity normal to the interface diffuser floor damper, according to yet still another aspect of the present invention.
Figure 14:
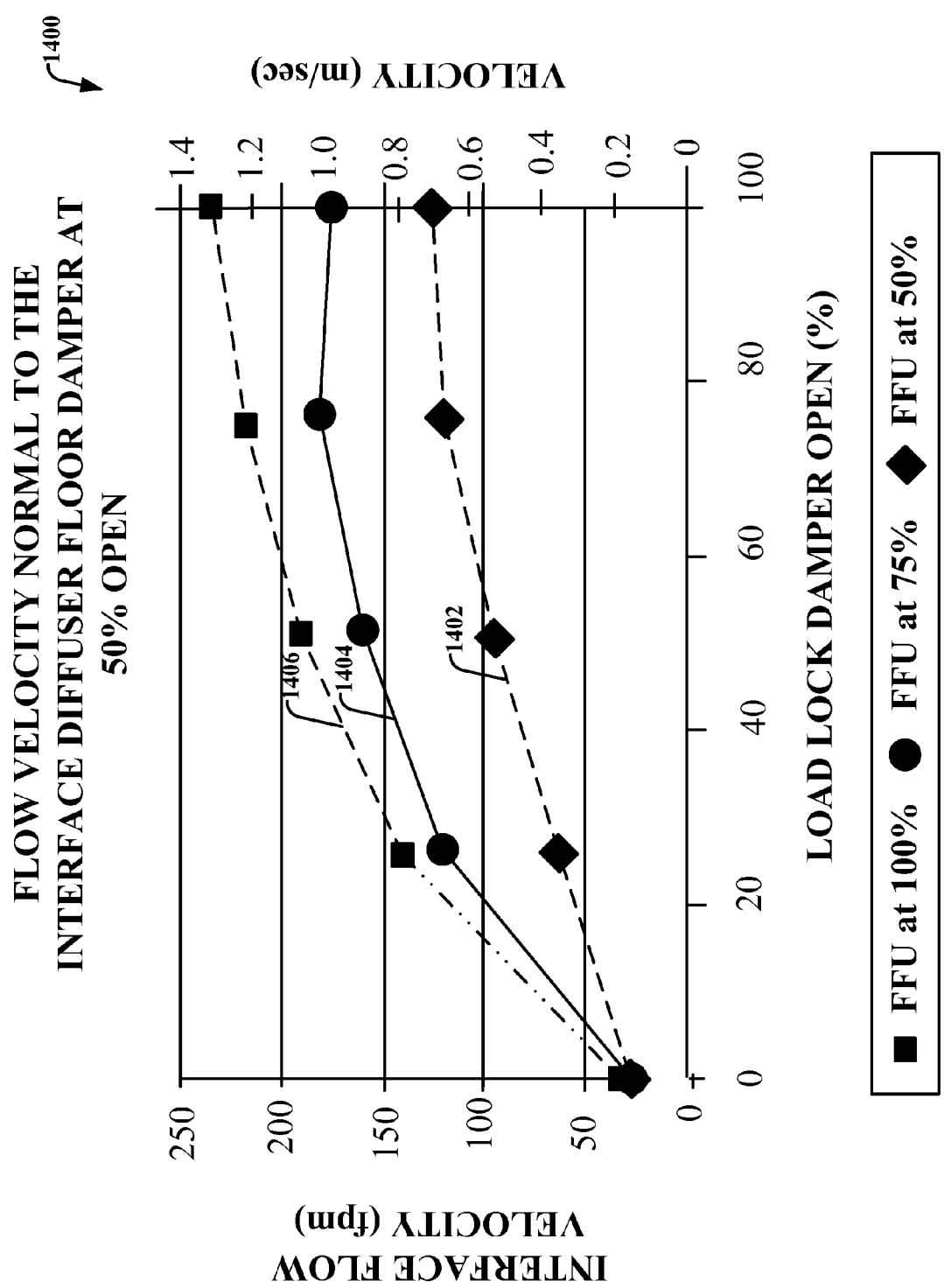
FIG. 14 is a graph of flow velocity normal to the interviews diffuser floor damper, according to another aspect of the present invention.

Referring to FIG. 13, in yet another embodiment of the present invention, is a graph 1300 that illustrates representative flow velocity normal to the interface diffuser with the floor damper at 100% open, that were obtained, comparing both average interface flow velocity (fpm) and velocity (m/s) vs. load lock damper open (%). The graph illustrates the data, as plotted on a linear x-axis, and a linear y-axis. The graph 1300 includes three different exemplary groupings of curves 1302 and 1304, and 1306. The point 1308 on curve 1308 is the CFD modeled condition with an average horizontal velocity of 0.5 m/sec. In other words, at 1.0 Pa, the average interface velocity was calculated using the model to equal 0.502 m/sec, whereas the actual test result at 1.04 Pa was 0.502 m/sec. Therefore the theoretical and the test rest are approximately equal. FIG. 14 is similar to FIG. 13 except the floor damper, discussed supra is set at 50% open, for example.

According to still another exemplary aspect of the present invention, FIG. 15 is a schematic block diagram of an exemplary method 1500 illustrating a method of minimizing the contaminants that settle on a workpiece as the workpiece is moved from the EFEM to a load lock chamber while reducing the cycle time in loading the workpiece. The block diagram FIG. 15 is according to an exemplary air management system e.g., FIGS. 1D and 7C. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 15, the method 1500 begins with rotating the semiconductor processing chamber to a desired angle to correspond to an ion implantation angle at 1502, for example. The processing chamber, for example, comprises an air management system fixedly attached to the chamber for diffusing air across a workpiece loaded inside the air management system or Zone 2. The air management system comprises a shroud, an interface panel configured with a moving diffuser, wherein the moving diffuser is generally configured with air deflecting vanes, and an adjustable damper configured to control the pressure within Zone 2. The moving diffuser provides an opening between Zone 1, the equipment/environmental front end module outside the air management system (AMS). The AMS further comprises a support surface or platen for supporting the workpiece, wherein the moving diffuser is configured to move in order to align a workpiece motion device, e.g., robot, the air diffuser and the platen within the chamber interior of Zone 2 resulting in a reduced workpiece loading time.

At 1504 the air diffuser is translated along an arcuate path, for example. The air diffuser and process chamber can be driven separately using motors and wireless communication, for example, or the drive rotating the process chamber can also drive a linkage or a gear train for example that drive the air diffuser in a direction opposite to the process chamber. The inventors recognized the advantage of the moveable air diffuser (e.g., FIGS. 1D and 2C) that allowed the movement of the process chamber and yet allowed the concurrent movement of the air diffuser so that transfer mechanisms within the EFEM had immediate access to the load lock chamber platen, for example, thereby reducing cycle times. At 1506 the transfer device, for example, a pick and place robotic arm transfers the workpiece from Zone 1 through the air diffuser opening and into Zone 2.

The robot at 1508 can then place the workpiece on a platen and clean air is then
supplied by a fan filter unit passes from Zone 1 through the air diffuser opening and deflected by the vanes. The air exits through the adjustable load lock damper and/or a floor damper. The method ends at 1508.

Accordingly, the present invention provides a faster cycle time for ion implantation, especially in systems where moving the process chamber relative to the EFEM is performed. It should be further noted that although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An air management system, comprising:
an ion implantation process chamber; and
an interface panel assembly having a diffuser associated therewith, wherein the interface panel is configured to guide the diffuser on a track, wherein the diffuser is configured to translate along a path of the ion implantation process chamber, and wherein the diffuser comprises one or more vanes configured to direct a flow of one or more gases in a controlled manner, and wherein the diffuser comprises one or more of a guide wheel and a cam follower.

2. The air management system of claim 1, wherein the diffuser further comprises one or more shields operably coupled to the diffuser, and wherein the interface panel assembly further comprises one or more shield housings, wherein the one or more shields are pre-tensioned and configured to move with respect to the one or more shield housings concurrent with the translation of the diffuser.

3. The air management system of claim 1, wherein the one or more gases comprise one or more of air and nitrogen.

4. The air management system of claim 1, further comprising one or more shields operably coupled to the diffuser via a rotating joint.

5. The air management system of claim 4, wherein the rotating joint comprises one or more of a ball joint, a swivel joint, and a hinge pivot.

6. The air management system of claim 1, wherein the diffuser is movably coupled to the ion implantation process chamber via one or more of a gear train, a mechanical linkage, and a belt drive.

7. An air management system, comprising:
   an ion implantation process chamber;
   an exhaust damper, a workpiece platen, and a containment shroud, wherein the containment shroud is configured to cover the workpiece platen, and wherein the containment shroud is further configured to maintain a position of the exhaust damper; and
   an interface panel assembly having a diffuser associated therewith, wherein the interface panel is configured to guide the diffuser on a track, wherein the diffuser is configured to translate along a path of the ion implantation process chamber, and wherein the diffuser further comprises one or more vanes configured to direct a flow of one or more gases in a controlled manner.

8. An airflow management system, comprising:
   a workpiece platen;
   an environmental front end module having a generally atmospheric environment defined therein;
   an ion implantation process chamber configured to generally define a vacuum environment therein, wherein the vacuum environment is selectively isolated from the generally atmospheric environment, wherein the ion implantation process chamber is configured to move relative to the environmental front end module along a path and wherein the process chamber is further configured to provide a generally uniform dose of ions to a workpiece residing therein from an ion beam associated therewith;
   a diffuser, wherein the diffuser comprises one or more guide wheels and one or more cam followers;
   an interface panel comprising a structural framework configured to support and guide the diffuser on a track, wherein the diffuser is configured to translate along the path of the process chamber; and
   a fan filter unit in fluid communication with the diffuser and workpiece platen, wherein the fan filter unit is configured to supply and filter one or more gases passing therethrough.

9. The airflow management system of claim 8, wherein the interface panel comprises one or more shield housings, and wherein the diffuser comprises one or more shields operably coupled thereto, wherein the one or more shields are pre-tensioned and configured to translate with respect to the one or more shield housings concurrent with the translation of the diffuser.

10. The airflow management system of claim 8, wherein the one or more gases comprise one or more of air and nitrogen.

11. The airflow management system of claim 8, further comprising a containment shroud configured to cover the workpiece platen, wherein the containment shroud is further configured to maintain a position of an exhaust damper.

12. The airflow management system of claim 8, further comprising one or more shields operably coupled to the diffuser via a rotating joint.

13. The airflow management system of claim 12, wherein the rotating joint comprises one or more of a ball joint, a swivel joint, and a hinge pivot.

14. An ion implantation system, comprising:
   an environmental front end module generally residing in a first zone, wherein an atmospheric environment is generally defined in the first zone;
   a process chamber configured to generally define a vacuum environment therein, wherein the vacuum environment is selectively isolated from the generally atmospheric environment, and wherein the process chamber is further configured to provide a generally uniform dose of ions to a workpiece residing therein from an ion beam associated therewith;
   an airflow management system fixedly coupled to the process chamber, wherein the airflow management system generally surrounds a second zone and comprises a diffuser mounted on an interface panel, and wherein the interface panel is configured to guide the diffuser on a track, wherein the diffuser is configured to translate along a path, therein permitting the process chamber to move relative to the environmental front end module, and wherein the diffuser comprises one or more of guide wheels and cam followers;
   a workpiece platen positioned in the second zone;
   a robot, wherein the robot is configured to transport a semiconductor workpiece through the diffuser between the environmental front end module in the first zone and the workpiece platen in the second zone; and
   a fan filter unit in fluid communication with the diffuser and the workpiece platen, wherein the fan filter unit is configured to supply and filter one or more gases from the first zone and over the workpiece platen in the second zone through the diffuser.

15. The ion implantation system of claim 14, wherein the robot is configured to translate along a course that allows the workpiece to be passed through the diffuser.

16. The ion implantation system of claim 15, wherein the robot is configured to translate along a course comprising one or more of a linear pathway and a curvilinear pathway.

17. The ion implantation system of claim 14, wherein the diffuser comprises one or more shields, wherein the shields are pre-tensioned to move in and out of one or more shield housings on the interface panel as the diffuser is translated.

18. The ion implantation system of claim 14, further comprising a containment shroud generally configured to cover the workpiece platen, wherein the containment shroud is further configured to maintain a position of an exhaust damper.

19. The ion implantation system of claim 14, wherein the diffuser is further configured to attach to the one or more shields via a rotating joint.

20. The ion implantation system of claim 19, wherein the rotating joint comprises one or more of a ball joint, swivel joint and hinge pivot.

21. A method for reducing a load time in an ion implantation system, the method comprising:
   rotating a process chamber to a desired ion implantation angle;
   translating an air diffuser along an arcuate path in a direction opposite the rotation of process chamber, wherein the air diffuser is non-fixedly attached to an interface panel with a track to guide the air diffuser in a desired trajectory;
   loading a workpiece from a first zone to a second zone through the air diffuser; and
   supplying clean air within the first zone.

22. The method of claim 21, wherein the air diffuser comprises one or more of guide wheels and cam followers.

23. The method of claim 21, wherein the air diffuser further comprises one or more shields rotatably attached to the air diffuser, wherein the one or more shields are pre-tensioned to move in to and out of one or more shield housings of the interface panel as the air diffuser is translated.

24. The method of claim 21, wherein the air diffuser is further configured to diffuse one or more of nitrogen and other gases.

25. The method of claim 21, wherein the air diffuser is connected to the process chamber by one or more of a gear train, a mechanical linkage and a belt drive.

* * * * *